(12) United States Patent
Castiglia et al.

(10) Patent No.: US 11,158,758 B2
(45) Date of Patent: Oct. 26, 2021

(54) SUPERLUMINESCENT DIODES AND DIODE MODULES

(71) Applicant: EXALOS AG, Schlieren (CH)

(72) Inventors: Antonino Francesco Castiglia, Schlieren (CH); Marco Rossetti, Schlieren (CH); Marco Malinverni, Schlieren (CH); Marcus Dülk, Schlieren (CH); Christian Velez, Schlieren (CH)

(73) Assignee: EXALOS AG, Schlieren (CH)

( * ) Notice: Subject to any disclaimer, the term of this patent is extended or adjusted under 35 U.S.C. 154(b) by 135 days.

(21) Appl. No.: 16/511,374

(22) Filed: Jul. 15, 2019

(65) Prior Publication Data

US 2020/0185884 A1    Jun. 11, 2020

(30) Foreign Application Priority Data

Dec. 6, 2018 (GB) ...................... 1819945

(51) Int. Cl.
*H01S 5/22*      (2006.01)
*H01S 5/0233*    (2021.01)
(Continued)

(52) U.S. Cl.
CPC ...... *H01L 31/1848* (2013.01); *H01L 25/0753* (2013.01); *H01L 25/0756* (2013.01);
(Continued)

(58) Field of Classification Search
CPC ............. H01L 31/1848; H01L 25/0753; H01L 25/0756; H01L 33/0045; H01S 5/4093; H01S 5/023; H01S 5/0233; H01S 5/22
See application file for complete search history.

(56) References Cited

U.S. PATENT DOCUMENTS

| 5,252,839 A | 10/1993 | Fouquet |
| 6,184,542 B1 | 2/2001 | Alphonse |

(Continued)

FOREIGN PATENT DOCUMENTS

| JP | 2005340644 | 5/2004 |
| WO | 0167497 A | 9/2001 |

OTHER PUBLICATIONS

"Nitride emitters go nonpolar" Schwarz and Kneissl, Phys. stat. sol. (RRL) 1, No. 3, A44-A46 (2007) / DOI 10.1002/pssr.200750018, © 2007 WILEY-VCH Verlag GmbH & Co. KGaA, Weinheim.

*Primary Examiner* — Yuanda Zhang
(74) *Attorney, Agent, or Firm* — Law Office Of Michael Antone; Michael Antone

(57) ABSTRACT

Superluminescent light emitting diode, SLED, devices and modules are provided. A multi-wavelength SLED device is fabricated by sequentially depositing adjacent epitaxial stacks onto a substrate to form a monolithic chip structure. Each epitaxial stack includes n-type layers, active layers and p-type layers. A ridge is formed in the p-type layers between the end facets of the chip to induce a waveguiding region in the active layers. Different ones of the epitaxial stacks emit at different wavelength ranges. A module is made by packaging one of the above SLED devices with another SLED device, with one inverted relative to the other to form a triangle of emitters as viewed end on, for example a triangle of red, green and blue emitters. The SLED devices and modules may find use in projection, endoscopic, fundus imaging and optical coherence tomography systems.

24 Claims, 20 Drawing Sheets

(51) Int. Cl.
  *H01L 31/18*    (2006.01)
  *H01S 5/30*     (2006.01)
  *H01S 5/50*     (2006.01)
  *H01S 5/02*     (2006.01)
  *H01L 33/00*    (2010.01)
  *H01L 25/075*   (2006.01)
  *H01S 5/023*    (2021.01)
  *H01S 5/40*     (2006.01)

(52) U.S. Cl.
  CPC .......... *H01L 33/0045* (2013.01); *H01S 5/023* (2021.01); *H01S 5/0203* (2013.01); *H01S 5/0206* (2013.01); *H01S 5/0233* (2021.01); *H01S 5/22* (2013.01); *H01S 5/3054* (2013.01); *H01S 5/4093* (2013.01); *H01S 5/50* (2013.01)

(56) References Cited

U.S. PATENT DOCUMENTS

| | | |
|---|---|---|
| 9,837,790 B1 | 12/2017 | Raring et al. |
| 2003/0168666 A1 | 9/2003 | Okuyama et al. |
| 2007/0076775 A1* | 4/2007 | Bessho .................... G11B 7/22 372/50.121 |
| 2007/0177648 A1* | 8/2007 | Tanaka ................. G11B 7/1275 372/50.121 |
| 2008/0310471 A1* | 12/2008 | Bessho ................. H01S 5/4043 372/44.01 |
| 2009/0127570 A1 | 5/2009 | Tamai et al. |
| 2010/0067559 A1* | 3/2010 | Inoue ..................... H01S 5/042 372/50.121 |
| 2010/0080001 A1 | 4/2010 | Kunoh et al. |
| 2010/0140632 A1 | 6/2010 | Doussi |
| 2010/0189146 A1* | 7/2010 | Bessho ................. H01S 5/4043 372/43.01 |
| 2011/0286484 A1 | 11/2011 | Raring et al. |
| 2012/0287958 A1 | 11/2012 | Lell et al. |
| 2013/0242310 A1 | 9/2013 | Matsuu et al. |
| 2014/0092391 A1 | 4/2014 | Matsuu et al. |
| 2016/0315450 A1 | 10/2016 | Raring et al. |
| 2016/0372893 A1 | 12/2016 | McLaurin et al. |
| 2017/0133553 A1 | 5/2017 | Kong et al. |

* cited by examiner

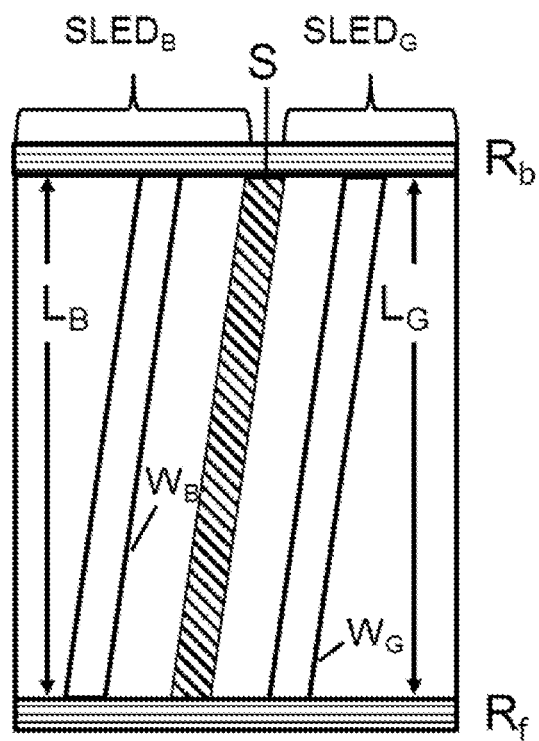
FIG. 8D1
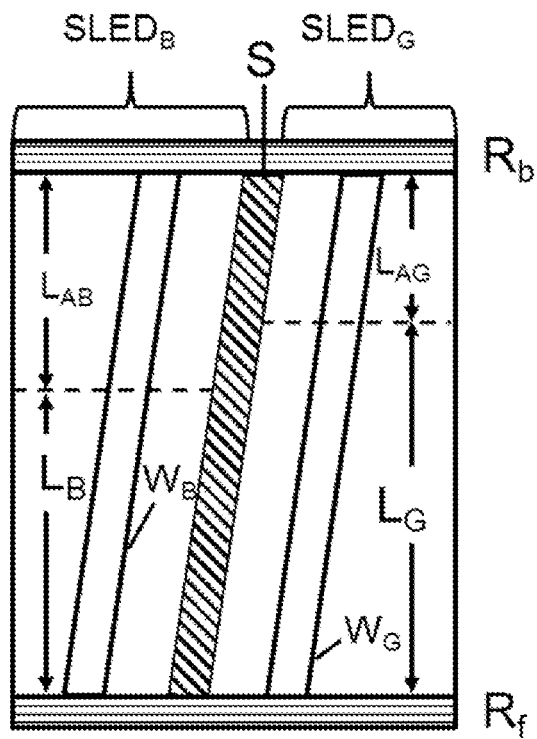
FIG. 8D2

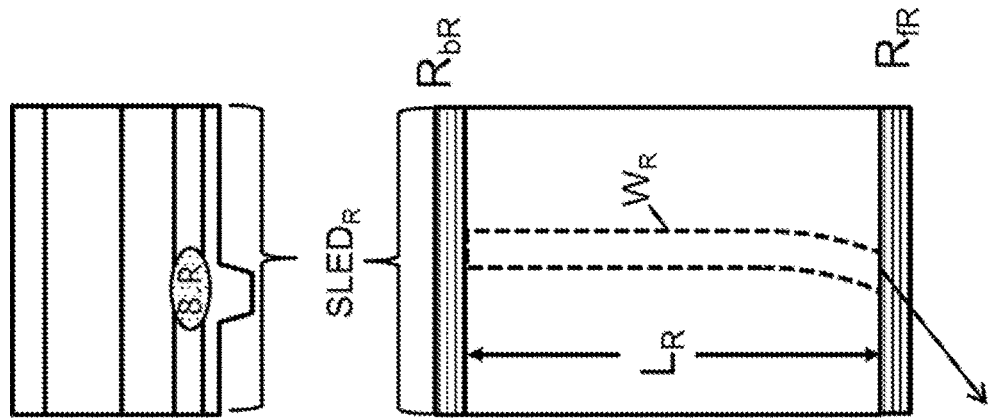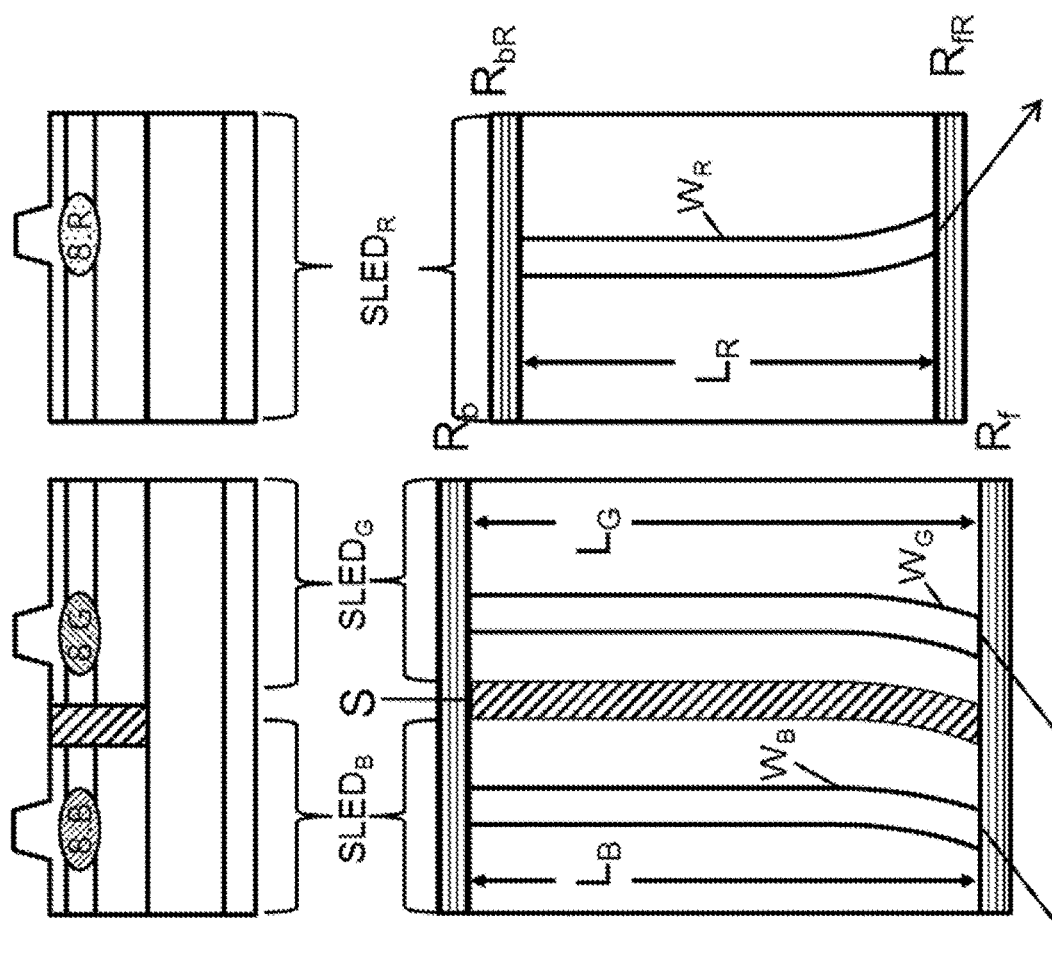
FIG. 9B2  FIG. 9B1  FIG. 9A

SUPERLUMINESCENT DIODES AND DIODE MODULES

CROSS-REFERENCE TO RELATED APPLICATIONS

This US non-provisional patent application is a continuation-in-part of and claims the benefit of and priority to U.K. Patent Application No. GB 1819945.5 filed on 6 Dec. 2018, which is incorporated herein by reference in its entirety.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

The invention relates to superluminescent light emitting diodes (SLEDs) and how to fabricate and package multiple such SLEDs into a compact light module.

SLEDs are important for applications where semiconductor laser diodes are unsuitable, for example because the coherence of laser light cannot be tolerated or because a broadband emission spectrum is needed.

For some applications it is desired to provide a source assembly with three SLEDs to emit red, blue and green light respectively. One such application is for display purposes, e.g. for a projector, to provide an RGB, i.e. red-green-blue, output. RGB output is also suitable for producing white light. Another application of interest is optical coherence tomography (OCT) which requires a highly directional and low-coherence source and benefits from a broad band of emission in the case of static-field OCT, so a source assembly comprising two or more SLEDs with overlapping emission ranges is attractive. For OCT, the wavelength range of interest may not be the visible range, but rather a range from red to near-infrared, e.g. wavelengths from 700 nm to 1.5 µm.

Much current commercial technology for SLEDs, and also laser diodes, relates to edge-emitting ridge structures. The principal materials systems of choice are GaAlInN (sometimes referred to as GaN-based or nitride-based for short in the following), GaAlInP (sometimes referred to as phosphide-based in the following) and GaAlAs (sometimes referred to as arsenide-based in the following). For commercial visible SLEDs, phosphide- and arsenide-based systems are used for red wavelengths and nitride-based systems for blue and green wavelengths.

It is desirable to produce a compact SLED source, since compactness makes it more convenient to route the multiple emitted beams, e.g. three RGB beams, using the minimum number and size of free-space optical components, such as lenses, mirrors and so forth.

While the literature specifically on edge-emitting ridge SLED fabrication is relatively sparse, there is more extensive literature on edge-emitting ridge laser fabrication. In particular, the following documents disclose fabrication methods to provide two or three edge-emitting ridge lasers arranged close to each other on a common substrate, wafer or submount, thereby to provide a compact edge-emitting ridge laser assembly that emits at multiple different wavelengths, such as two or three of red, green and blue wavelengths.

US2012287958A1 (Osram Opto Semiconductors GmbH) discloses an edge-emitting ridge laser diode assembly to provide a white light source. The GaN-based assembly is grown on an n-type GaN substrate. Two stacks/ridges are fabricated side-by-side on the substrate to provide two active zones and corresponding laser diodes, wherein by varying the indium concentration laterally across the layers one of the laser diodes emits at a wavelength in the blue-to-UV range and the other in the green-to-yellow range, wherein these two wavelengths mix to create white light.

US2009127570A1 (Rohm Co Ltd) discloses a GaN-based edge-emitting ridge laser diode assembly with blue and green emission wavelengths. The blue and green laser diodes are grown alongside each other on a common GaN substrate. The intended application is for a light source in an optical disk system such as a compact disc (CD) or digital versatile disc (DVD) needing both green and blue outputs. Two parallel ridge laser structures for blue emission are fabricated side by side. This is done by the steps of: epitaxial deposition of layers; depositing two parallel stripes of mask material where the ridges are to be defined; and dry etching down to a contact layer to form two parallel ridge laser structures. A silicon oxide or silicon nitride insulating layer is then deposited followed by a mask layer which is then structured to leave a gap along a strip midway between the two existing ridge laser structures. The strip of insulating layer that is exposed by the mask is then wet etched away down to the GaN substrate in a stripe midway between the two ridges. A different laser structure for green emission is then epitaxially deposited on the GaN substrate, so that after removal of the mask material three ridge laser structures are arranged side by side with the middle one being for green emission and the two outer ones being the same and for blue emission.

US2005286591A1 (Samsung Electro-Mechanics Co Ltd) discloses an edge-emitting ridge laser diode assembly with three stacks/ridges to provide three active zones and corresponding laser diodes. The assembly emits in three different wavelengths in the red, green and blue to provide a light source intended for an optical disc system, such as a CD or DVD. The assembly is made by fabricating each of the blue, green and red structures in sequence as follows. A first laser structure based on GaN for emitting in the blue is grown on a sapphire substrate by blanket deposition followed by etching away to leave a ridge and expose neighboring areas of the sapphire substrate. A second laser structure based on GaN for emitting in the green is then grown on the exposed parts of the sapphire substrate. The unwanted excess that was grown over the ridge of the first laser structure is then removed by further etching, to provide two ridges side by side for blue and green emission. The two-ridge epitaxial structure is then separated from the sapphire substrate by lift-off and attached to a GaAs substrate. A third laser structure based on GaAlInP for emitting in the red is then deposited on the GaAs substrate which also results in unwanted overgrowth on the neighboring GaN ridges. The unwanted overgrowth is then removed by etching to provide three ridges side by side for blue, green and red emission.

US2011286484A1 (Soraa, Inc) discloses an edge-emitting ridge laser diode assembly comprising red, green and blue edge-emitting ridge laser chips arranged side-by-side on a common submount. The blue and green ridge laser diodes are fabricated with GaN epitaxial layers on either individual GaN substrates or a common GaN substrate, and the red ridge laser is fabricated separately using GaAlInP epitaxial layers on another substrate which is not specified. The two or three chips substrates are then attached to a common submount so that their active layers are co-planar and emit with parallel optical axes.

US2016315450A1 (Soraa Laser Diode, Inc.) has a similar disclosure to US2011286484A1.

US2016372893A1 (Soraa Laser Diode, Inc.) discloses an RGB laser diode assembly comprising three ridge laser structures for red, green and blue emission. The three laser structures are separately fabricated and then after lift-off from their respective substrates bonded one after the other on top of a carrier wafer so that the first structure is on top of the wafer, the second structure is on top of the first structure and the third structure is on top of the second structure. The three structures are arranged on top of one another with their ridges laterally offset. Alternatively, it is proposed that selective area bonding is used to arrange separately grown laser structures side-by-side on a common carrier wafer.

US2010080001A1 (Sanyo Electric Co Ltd) discloses an edge-emitting ridge laser diode assembly comprising three edge-emitting ridge laser structures arranged side-by-side on a common GaN substrate to provide red, green, and blue emission beams. The intended application is for a projector source with modulation provided by liquid crystal panels or digital micromirror device arrays. To prepare for depositing a first laser structure, the GaN substrate is initially covered with an oxide layer, and a stripe is removed from the oxide layer to reveal a strip of the substrate. The layers for the first laser structure for blue emission are then deposited on the substrate. To deposit the layers for a second laser structure, the oxide layer is etched away to form a stripe adjacent to and alongside the first laser structure. The layers for the second laser structure for green emission are then deposited on the substrate. To accommodate a third laser structure for red emission, an insulating layer is deposited on top of the GaN substrate with its first and second laser structures and then an electrode layer. Then, the third laser structure, which has been separately grown on a different substrate with GaAlInP layers, is lifted-off from its substrate and attached either junction down, i.e. upside down (as shown in FIG. 8 of the document), or junction up, i.e. right way up in relation to its growth sequence (as described as an alternative in the text at paragraph 0126 of the document), onto the electrode layer alongside the second laser structure.

WO01/67497A1 (NTU Ventures) discloses epitaxial growth of a quantum well structure which is post-processed by local melting to cause quantum well intermixing. Namely, adjacent stripes are differently melted to cause different amounts of intermixing between the quantum well and barrier materials. The differential melting results in each stripe has a different emission wavelength.

US2014092391A (Canon) discloses epitaxial growth of a layered structure followed by post-processing to etch out two parallel ridge waveguide SLED structures from the layered structure. The two ridge waveguides are configured differently so that the current densities are different in operation. Since emission wavelength is a function of current density, this means that the two ridge waveguides emit at slightly shifted wavelength ranges thus exploiting the known relationship between emission wavelength and current density of a SLED.

US20130242310A (Canon) uses post-processing to etch out individual SLED ridge structures from a common epitaxial layer stack. The SLEDs have different lengths which causes them to operate under different current injection regimes and thus emit at slightly different wavelength ranges thus exploiting the known relationship between emission wavelength and current density of a SLED.

JP2005340644A (NTT) uses post-processing to etch out individual SLED ridge structures from a common epitaxial layer stack. Different ridge lengths are used to produce slightly different emission wavelengths thus exploiting the known relationship between emission wavelength and current density of a SLED.

SUMMARY OF THE INVENTION

According to one aspect of the invention there is provided a SLED device comprising:
   a. front and back facets;
   b. a substrate;
   c. a first epitaxial stack arranged on the substrate and including in sequence along an epitaxial growth axis: one or more n-type doped layers, one or more active layers forming an active region dimensioned and configured to generate and amplify light emission over a first wavelength range of between 3 nm and 100 nm at full width half maximum, and one or more p-type doped layers, wherein the first epitaxial stack has a first ridge formed in the first p-type doped layers and extending at least part way from the front facet to the back facet to induce a first waveguiding region in the first active layers that defines at least part of a first optical path between the front and back facets; and
   d. a second epitaxial stack arranged on the substrate alongside the first epitaxial stack and including in sequence along the epitaxial growth axis: one or more n-type doped layers, one or more active layers forming an active region dimensioned and configured to generate and amplify light emission over a second wavelength range of between 3 nm and 100 nm at full width half maximum, and one or more p-type doped layers, wherein the second wavelength range is different from the first wavelength range, and wherein the second epitaxial stack has a second ridge formed in the second p-type doped layers and extending at least part way from the front facet to the back facet to induce a second waveguiding region in the second active layers that defines at least part of a second optical path between the front and back facets.

The respective active layers of the first and second epitaxial stacks may be made of respective first and second semiconductor materials which are different from each other. The different semiconductor materials may be different alloy compositions of two materials in the same materials system. The materials system may be nitride-based, phosphide-based or arsenide-based. Composing the active layers of the respective epitaxial stacks of different semiconductor materials can provide for, or at least contribute to, the difference between the first wavelength range and the second wavelength range. Other design parameters may also be used to provide, or contribute to, the wavelength range difference, such as by having the active layers comprising quantum wells of different widths and hence different interband recombination energies between the sub-bands.

In certain embodiments, the substrate and the first and second epitaxial stacks are GaInAlN-based. The first and second active regions may be made of different alloy compositions of GaInAlN, where the difference in alloy composition between the active regions of the first and second epitaxial stacks provides for, or at least contributes to, the difference between the first and second wavelength ranges.

A particular combination is when the first active region (first stack) comprises an alloy of $Ga_{(x)}In_{(1-x)}N$ and the second active region (second stack) comprises an alloy of $Ga_{(y)}In_{(1-y)}N$ with $x \neq y$. The active layers of a blue-emitting stack may comprise say 15% In; a green-emitting stack 25% In; and a red-emitting stack 35% In. The active layers may be bulk or comprise single or multiple quantum well layers made of GaInN. In the case of quantum well embodiments, some Al in the alloy may be used to form the quantum well barrier layers, i.e. the barriers may be GaInAlN.

To suppress lasing in the first and second wavelength ranges, one or more of the following features may be provided:
a) the first and/or second ridges extend such that the first and second optical paths intersect with the front facet, and optionally also the back facet, at first and second non-normal angles;
b) the first and/or second ridges are straight and extend at a non-normal angle to the front facet;
c) the first and/or second ridges include a curved portion such that the first and second optical paths intersect with the front facet at first and second non-normal angles;
d) first and/or second absorber materials are provided which are respectively absorbent over the first and second wavelength ranges, the first and second absorber materials being located adjacent the back facet;
e) the first and/or second ridges terminate part way between the front and back facets;
f) the first and/or second ridges terminate part way between the front and back facets at a tilt angle so that reflections from the back facet are inhibited from coupling back into the waveguide; and
g) front and/or back anti-reflection coatings are provided on the front and/or back facets.

The SLED device may further comprise a third epitaxial stack arranged on the substrate alongside the second epitaxial stack and including in sequence: one or more n-type doped layers, one or more active layers forming an active region dimensioned and configured to generate and amplify light emission over a third wavelength range of between 3 nm and 100 nm at full width half maximum, and one or more p-type doped layers, wherein the third wavelength range is different from the first and second wavelength ranges, and wherein the third epitaxial stack has a third ridge formed in the third p-type doped layers and extends at least part way from the front facet to the back facet to induce a third waveguiding region in the third active layers that defines at least part of a third optical path between the front and back facets. In certain embodiments, the third epitaxial stack is GaAlInN-based.

To suppress lasing in the third wavelength range, one or more of the following features is provided:
a) the third ridge extends such that the third optical path intersects with the front facet, and optionally also the back facet, at a non-normal angle;
b) the third ridge is straight and extends at a non-normal angle to the front facet;
c) the third ridge includes a curved portion such that the third optical path intersects with the front facet at a non-normal angle;
d) third absorber material is provided which is absorbent over the third wavelength range, the third absorber material being located adjacent the back facet;
e) the third ridge terminates part way between the front and back facets;
f) the third ridge terminates part way between the front and back facets at a tilt angle so that reflections from the back facet are inhibited from coupling back into the waveguide; and
g) front and/or back anti-reflection coatings are provided on the front and/or back facets.

According to another aspect of the invention there is provided a SLED device comprising:
front and back facets;
a substrate;
a plurality of at least four epitaxial stacks arranged adjacent to each other on the substrate,
each epitaxial stack including in sequence along an epitaxial growth axis:
a) one or more n-type doped layers;
b) one or more active layers forming an active region dimensioned and configured to generate and amplify light emission over a wavelength range of between 3 nm and 100 nm at full width half maximum; and
c) one or more p-type doped layers;
d) a ridge formed in the p-type doped layers and extending at least part way from the front facet to the back facet to induce a waveguiding region in the active layers that defines at least part of an optical path between the front and back facets;
wherein the epitaxial stacks are configured such that there are at least two different wavelength ranges among the epitaxial stacks, namely a first wavelength range and a second wavelength range which is different from the first wavelength range.

In some embodiments, the epitaxial stacks are arranged such that there is a first group of adjacent epitaxial stacks with the first wavelength range and a second group of adjacent epitaxial stacks with the second wavelength range. In other embodiments, the epitaxial stacks are arranged such that adjacent epitaxial stacks have the first wavelength range and the second wavelength range.

The different active regions may be made of different alloy compositions of a common semiconductor materials system, such as GaAlInN, as discussed above, where the difference in alloy composition between the active regions of the epitaxial stacks provides for, or at least contributes to, the difference between the wavelength ranges.

According to another aspect of the invention there is provided a SLED module comprising: a SLED device and a further SLED device.

The SLED device comprises:
front and back facets;
a substrate;
a first epitaxial stack arranged on the substrate and including in sequence along an epitaxial growth axis: one or more n-type doped layers, one or more active layers forming an active region dimensioned and configured to generate and amplify light emission over a first wavelength range of between 3 nm and 100 nm at full width half maximum, and one or more p-type doped layers, wherein the first epitaxial stack has a first ridge formed in the first p-type doped layers and extending at least part way from the front facet to the back facet to induce a first waveguiding region in the first active layers that defines at least part of a first optical path between the front and back facets; and
a second epitaxial stack arranged on the substrate alongside the first epitaxial stack and including in sequence along the epitaxial growth axis: one or more n-type doped layers, one or more active layers forming an active region dimensioned and configured to generate and amplify light emission over a second wavelength range of between 3 nm and 100 nm at full width half maximum, and one or more p-type doped layers, wherein the second wavelength range is different from the first wavelength range, and wherein the second epitaxial stack has a second ridge formed in the second p-type doped layers and extending at least part way from the front facet to the back facet to induce a second waveguiding region in the second active layers that defines at least part of a second optical path between the front and back facets.

The further SLED device comprises:
further front and back facets;
a further substrate;
a third epitaxial stack arranged on the further substrate including in sequence along a third epitaxial growth axis: one or more n-type doped layers, one or more active layers forming an active region dimensioned and configured to generate and amplify light emission over a third wavelength range of between 3 nm and 100 nm at full width half maximum, and one or more p-type doped layers, wherein the third wavelength range is different from the first and second wavelength ranges, and wherein the third epitaxial stack has a third ridge formed in the third p-type doped layers and extends at least part way from the further front facet to the further back facet to induce a third waveguiding region in the third active layers that defines at least part of a third optical path between the further front and back facets;
a mount on which are arranged the SLED device and the further SLED device, the further SLED device being inverted relative to the SLED device, so that in section through the front facet and further front facet first, second and third optical axes of the first, second and third waveguiding regions form an acute triangle.

(An acute triangle is one in which all three internal angles are less than 90 degrees.) In some embodiments, the acute triangle is an equilateral triangle to an approximation defined by its internal angles having values within 5 degrees of a geometric definition of equilateral. In other embodiments, the acute triangle is an isosceles triangle with its base defined by a line between the first and second optical axes, the triangle being isosceles to an approximation defined by its internal angles having values within 5 degrees of a geometric definition of isosceles.

In certain embodiments, the ridges generate a ridged surface structure in both the SLED and further SLED devices and, to provide a compact design, the mount arranges the SLED and further SLED such that their ridged surface structures at least partially intermesh. The internal angles of the acute triangle are preferably all less than 75 degrees, which is desirable in particular if the SLED and further SLED devices are to intermesh.

In some embodiments, the mount has a non-unitary construction. Namely, the mount may comprise a sub-mount on which is arranged the SLED device and a further sub-mount on which is arranged the further SLED device. The sub-mount and further sub-mount are connected to each other. During assembly, connecting the sub-mounts may be conveniently done after the SLEDs are arranged on their respective sub-mounts. In some embodiments, the SLED device and the further SLED device are arranged in the mount with a gap between them. In other embodiments, the SLED device and the further SLED device are arranged in physical contact with each other.

The substrate and epitaxial stacks of the SLED device may be GaAlInN-based and those of the further SLED device may be one of GaAlInN-based; GaAlInP-based; and GaAlAs-based.

According to another aspect of the invention there is provided a SLED module comprising:
a SLED device;
a further SLED device; and
a mount on which are arranged the SLED device and the further SLED device such that the further SLED device is inverted relative to the SLED device,
the SLED device comprising:
front and back facets;
a substrate;
a plurality of epitaxial stacks arranged adjacent to each other on a substrate,
each epitaxial stack including in sequence along an epitaxial growth axis:
a) one or more n-type doped layers;
b) one or more active layers forming an active region dimensioned and configured to amplify stimulated emission over a wavelength range of between 3 nm and 100 nm at full width half maximum; and
c) one or more p-type doped layers;
d) a ridge formed in the p-type doped layers and extending at least part way from the front facet to the back facet to induce a waveguiding region in the active layers that defines at least part of an optical path between the front and back facets;
the further SLED device comprising:
front and back facets;
a substrate;
a plurality of epitaxial stacks arranged adjacent to each other on a substrate,
each epitaxial stack including in sequence along an epitaxial growth axis:
a) one or more n-type doped layers;
b) one or more active layers forming an active region dimensioned and configured to amplify stimulated emission over a wavelength range of between 3 nm and 100 nm at full width half maximum; and
c) one or more p-type doped layers;
d) a ridge formed in the p-type doped layers and extending at least part way from the front facet to the back facet to induce a waveguiding region in the active layers that defines at least part of an optical path between the front and back facets;
wherein the mount arranges the SLED device and the further SLED device such that, in section through their front facets, a linear array of multiple groups of three waveguiding regions are formed, the waveguiding regions of each group having their optical axes forming an acute triangle.

In some embodiments, the acute triangle is an equilateral triangle to an approximation defined by its internal angles having values within 5 degrees of a geometric definition of equilateral. In other embodiments, the acute triangle is an isosceles triangle with its base defined by a line between the first and second optical axes, the triangle being isosceles to an approximation defined by its internal angles having values within 5 degrees of a geometric definition of isosceles.

In certain embodiments, the ridges generate a corrugated surface structure in both the SLED device and the further SLED device. The mount can then arrange the SLED device and the further SLED device such that their corrugated surface structures at least partially intermesh.

An example implementation provides a module in which the waveguiding regions of the SLED device comprise ones with a first wavelength range and ones with a second wavelength range and the waveguiding regions of the further SLED device comprise ones with a third wavelength range. The first, second and third wavelength ranges are preferably different from each other. Each group of three waveguiding regions may consist of one waveguiding region with the first wavelength range, one with the second wavelength range and one with the third wavelength range. The different wavelength ranges may have no overlap, e.g. there may be three wavelength ranges, one in the red, one in the green and on in the blue, such as is useful for display applications. Alternatively, the wavelength ranges may partially overlap, e.g. overlap so as to provide a single continuous wavelength range of emission over a wider range than is possible with a single SLED emitter, such as is useful for static-field OCT applications or white light sources. With partial overlap to provide a single continuous wavelength range, the partial overlaps may be arranged so that the output power spectrum is as constant as possible over the transition between outputs from the respective SLEDs.

Further aspects of the invention relate to methods of fabricating SLED devices.

According to one method aspect of the invention there is provided a method of fabricating a SLED device comprising:
  providing a substrate;
  depositing on the substrate a plurality of adjacent epitaxial stacks one after the other, each epitaxial stack including in sequence along an epitaxial growth axis:
  one or more n-type doped layers;
  one or more active layers forming an active region dimensioned and configured to generate and amplify light emission over a wavelength range of between 3 nm and 100 nm at full width half maximum; and
  one or more p-type doped layers;
  wherein after depositing the epitaxial stacks there is a defect region between each two adjacent stacks;
  etching away a part of the p-type doped layers and the defect regions to form a plurality of ridges for inducing respective waveguiding regions in the active layers; and
  depositing one or more contact layers to provide electrical contacts for driving the device.

According to another method aspect of the invention there is provided a method of fabricating a SLED device comprising:
  providing a substrate;
  depositing one or more n-type doped layers;
  depositing on the n-type doped layers a plurality of adjacent epitaxial stacks one after the other, each epitaxial stack including in sequence along an epitaxial growth axis:
  one or more active layers forming an active region dimensioned and configured to generate and amplify light emission over a wavelength range of between 3 nm and 100 nm at full width half maximum; and
  one or more p-type doped layers;
  wherein after depositing the epitaxial stacks there is a defect region between each two adjacent stacks;
  etching away a part of the p-type doped layers and the defect regions to form a plurality of ridges for inducing respective waveguiding regions in the active layers; and
  depositing one or more contact layers to provide electrical contacts for driving the device.

According to a still further method aspect of the invention there is provided a method of fabricating a SLED device comprising:
  providing a substrate;
  depositing one or more n-type doped layers;
  depositing on the n-type doped layers a plurality of adjacent epitaxial stacks one after the other, each epitaxial stack including one or more active layers forming an active region dimensioned and configured to generate and amplify light emission over a wavelength range of between 3 nm and 100 nm at full width half maximum, wherein after depositing the epitaxial stacks there is a defect region between each two adjacent stacks;
  depositing one or more p-type doped layers on the active layers;
  etching away a part of the p-type doped layers and the defect regions to form a plurality of ridges for inducing respective waveguiding regions in the active layers; and
  depositing one or more contact layers to provide electrical contacts for driving the device.

A joint definition of the above methods of fabricating an SLED device can be defined as follows: providing a substrate; and depositing a plurality of adjacent epitaxial stacks one after the other, each epitaxial stack including at least one active layer forming an active region dimensioned and configured to generate and amplify light emission over a wavelength range of between 3 nm and 100 nm at full width half maximum, wherein after depositing the epitaxial stacks there is a defect region between each two adjacent stacks. The n-type material can be provided either: by depositing a common n-type doped layer prior to depositing the epitaxial stacks; or by depositing respective n-type doped layers as part of the respective epitaxial stacks, wherein the n-type doped layers are deposited before, i.e. under, the respective active layers. The p-type material can be provided either: by depositing a common p-type doped layer on the epitaxial stacks, i.e. as a blanket; or by depositing respective p-type doped layers as part of the respective epitaxial stacks, wherein the p-type doped layers are deposited after, i.e. on top of, the respective active layers. Once the sequence of n-type doped layer(s), active layers and p-type doped layer(s) is in place, the method further comprises: etching away a part of the common p-type doped layer or the p-type doped layers and the defect regions to form a plurality of ridges for inducing respective waveguiding regions in the active layers; and depositing at least one contact layer to provide electrical contacts for driving the device.

In the above devices, modules and methods, the active layers of the different epitaxial stacks can be made of different semiconductor materials. This allows multiple different wavelength ranges to be generated in the different epitaxial stacks. The principal materials systems of interest for embodiments of the invention are nitride-based, phosphide-based and arsenide-based. In particular, phosphide- and arsenide-based systems may be used for near infrared and red wavelengths and nitride-based systems may be used for blue and green wavelengths.

The SLED devices as described herein is configured to generate and amplify light emission over a broad wavelength range compared to a laser structure. The wavelength range of an individual SLED emitter, as defined above by an epitaxial stack, associated ridge and end facets, may have a value between 3 nm and 100 nm at full width half maximum (FWHM), i.e. 3 dB attenuation level. With future developments in technology it may be possible to broaden the maximum wavelength range. The wavelength range covered by an individual SLED emitter as disclosed herein may have any value between 3 nm and 100 nm. With current technology and using the arsenide- and phosphide-based materials system wavelength ranges up to 100 nm are achievable in SLEDs with center wavelengths in the near infrared (NIR) and infrared (IR). With current technology and using the nitride-based materials system wavelength ranges up to 30 nm are achievable in blue and green SLEDs. For example, the wavelength range may have a value of 4, 5, 6, 7, 8, 9, 10, 11, 12, 13, 14, 15, 16, 17, 18, 19, 20, 21, 22, 23, 24, 25, 26, 27, 28, 29, 30, 35, 40, 45, 50, 60, 70, 80 or 90 nm.

The SLED devices and modules disclosed herein may find use in a variety of systems.

According to one system aspect of the invention there is provided a vision system, such as a pair of glasses, or a helmet with visor, configured to be placed on a human head incorporating a SLED device or module as described herein.

According to another system aspect of the invention there is provided an optical coherence tomography (OCT) system, comprising a SLED device or module as described herein. The OCT system could be for imaging of the eye, for example fundus imaging. The SLED device or module could act as an RGB light source.

According to a further system aspect of the invention there is provided an endoscope, laparoscope, bronchoscope or catheter system, comprising a SLED device or module as described herein, for example acting as an RGB light source.

BRIEF DESCRIPTION OF THE DRAWINGS

This invention will now be further described, by way of example only, with reference to the accompanying drawings.

FIG. 8D1 is a schematic plan view of an example SLED device with blue and green SLEDs, the SLEDs being arranged and configured as shown in FIG. 3A in combination with FIGS. 7A and 7D.

FIG. 8D2 is a schematic plan view of an example SLED device with blue and green SLEDs, the SLEDs being arranged and configured as shown in FIG. 3A in combination with FIGS. 7B and 7D.

FIG. 9A shows the same blue and green P-up SLED device as FIG. 8E both in plan view (as FIG. 8E) and section view (as FIG. 3A).

FIG. 9B1 shows in plan and front facet section views a P-up SLED for red emission, wherein the curved portion of its ridge waveguide has the opposite sense of tilt to the blue and green SLED structure of FIG. 9A, such that the red output beam will have the same output direction as the blue and green beams when the red SLED device is flipped over for integration with the blue and green SLED device.

FIG. 9B2 is another view of the red SLED of FIG. 9B1 in which the upper, section view is rotated 180 degrees around an axis perpendicular to the section, and the lower, plan view is correspondingly changed with the hidden ridge on the underside of the plan view being shown with dotted lines.

DETAILED DESCRIPTION

In the following detailed description, the repeated references to red, green and blue wavelength ranges, are specific labels that make the description of the examples convenient to understand. While these colors are technically significant for display and projection applications, it will be understood that they may be generalized to mean first, second and third different emission wavelength bands from first, second and third SLEDs. Moreover, one or more of these bands need not be in the visible region, since for example one or more of the bands may be in the near infrared, or near ultraviolet.

Figure 1:
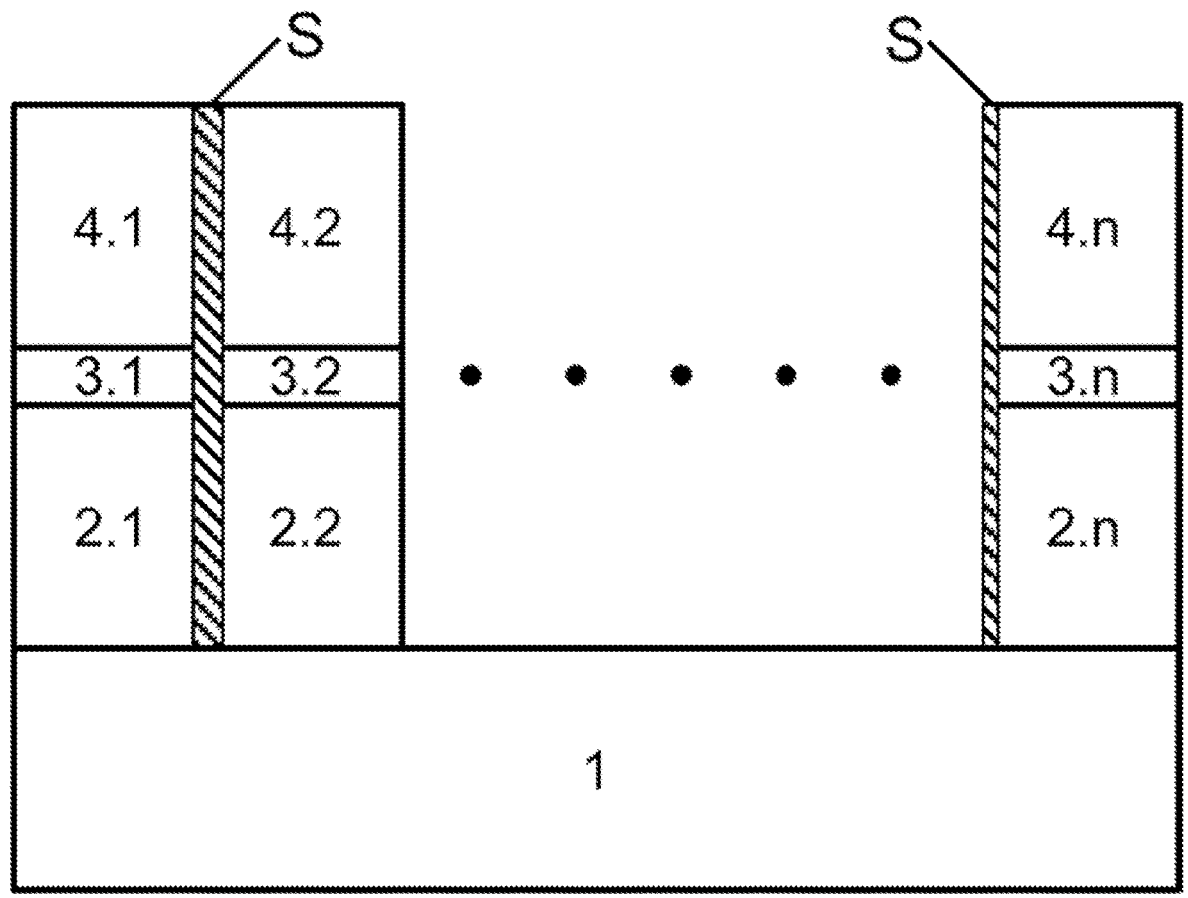
FIG. 1 is a schematic section view of a monolithic SLED structure in a semi-finished state comprising 'n' adjacent epitaxial stacks separated laterally by trenches.

FIG. 1 is a schematic section view of a monolithic SLED structure in a semi-finished state comprising a substrate 1 on which are arranged 'n' adjacent epitaxial stacks 2.x, 3.x, 4.x separated laterally by regions S, the 'n' stacks serving as a basis for 'n' SLEDs, which collectively emit at two or more different wavelength ranges. The two or more different wavelength ranges may be in the visible range, which we define as 380 nm to 750 nm. For example, there may be two emission wavelength ranges, one in the blue region and one in the green region.

The body of each light emitting region is made of one or a multiple number of light emitting layers 3.x, referred to as active layers, sandwiched between n-type doped layers 2.n and p-type doped layers 4.x. The active layers may contain Al, In, Ga, N elements. The active layers may form a multi-quantum well structure. The p-type layers 4.x in the arrangement of FIG. 1 are above the active layers, towards the surface of the device, and the n-type layers 2.x are below the active layers, in between the active layers 3.x and a substrate 1. The substrate 1 may for example be a c-plane free-standing GaN substrate. Both n-type and p-type layers may contain Al, In, Ga, N elements. The different layers 2.x, 3.x, 4.x are grown epitaxially on the substrate 1 and separated from each other laterally by defect regions S which are typically optically and electrically inactive. The defect regions are referred to in the following as exclusion regions. They are an unwanted artefact of the epitaxial growth process as described further below. The exclusion regions are regions of poor quality and/or damaged material and/or regions near a lateral surface that are in the depletion region. The exclusion regions are located at the lateral sides of the individual stacks. The boundaries between the stacks have the form of trenches, which may be filled with material, be unfilled or be part filled, depending on details of how the growth has taken place. The lateral width of the exclusion regions S is, for example, between 5 and 20 μm.

Figure 2A:
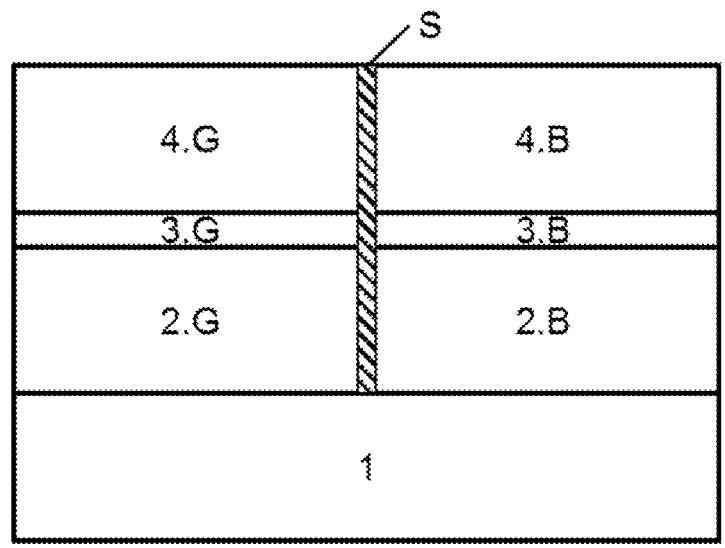
FIG. 2A is a schematic section view of a monolithic SLED structure in a semi-finished state comprising two adjacent epitaxial stacks intended for emitting in the green and blue respectively in the finished device.

FIG. 2A is a schematic section view of a monolithic SLED structure in a semi-finished state comprising two adjacent epitaxial stacks intended for emitting in the green and blue respectively in the finished device, i.e. a monolithic BG SLED structure. The structure is formed on a substrate 1 and includes a first stack of n-doped, active and n-doped layers 2.G, 3.G and 4.G respectively for green emission as well as a second stack of n-doped, active and p-doped layers 2.B, 3.B and 4.B respectively for blue emission. The first and second stacks are separated from each other laterally by exclusion regions S in the form of filled or unfilled trenches. The width of the exclusion regions is, for example, between 5 and 20 μm.

For example, the first SLED region is for delivering amplified blue light emission with a center wavelength between 440 nm and 470 nm and a full width at half maximum, i.e. 3 dB attenuation level, of between 3 nm and 30 nm, the second SLED region is for delivering amplified green light emission with a center wavelength between 490 nm and 530 nm and a full width at half maximum of between 3 nm and 30 nm.

Figure 2B:
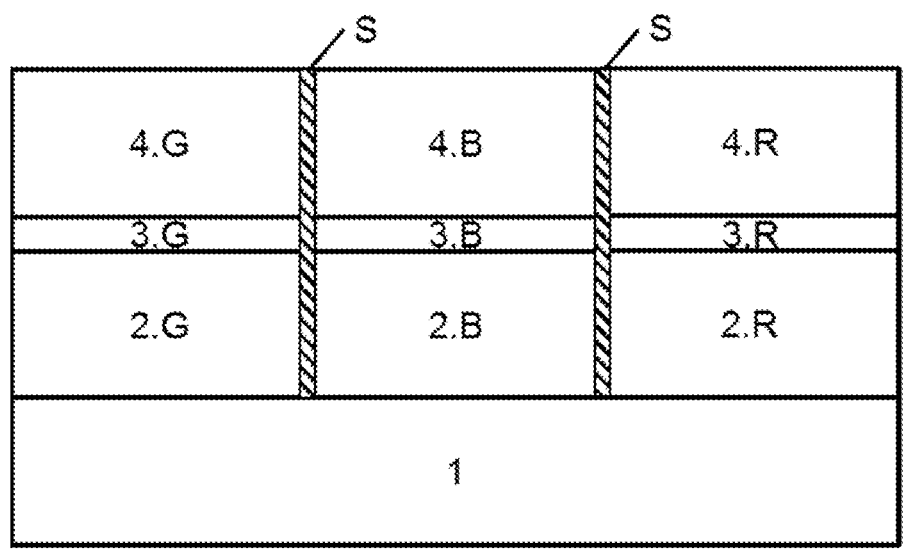
FIG. 2B is a schematic section view of a monolithic SLED structure in a semi-finished state comprising three adjacent epitaxial stacks intended for emitting in the red, green and blue in the finished device.

FIG. 2B is a schematic section view of a monolithic SLED structure in a semi-finished state comprising three adjacent epitaxial stacks intended for emitting in the green, blue and red respectively in the finished device, i.e. a monolithic RGB SLED structure. The structure is formed on a substrate 1 and includes a first stack of n-doped, active and n-doped layers 2.G, 3.G and 4.G respectively for green emission, as well as a second stack of n-doped, active and n-doped layers 2.B, 3.B and 4.B respectively for blue emission, and also a third SLED stack of n-doped, active and p-doped layers 2.R, 3.R and 4.R respectively for red emission. The first, second and third stacks are separated from each other laterally by exclusion regions S For example, the blue light emission may have a center wavelength between 440 nm and 470 nm and a full width at half maximum, i.e. 3 dB attenuation level, of between 3 nm and 30 nm, and the green emission a center wavelength between 490 nm and 530 nm and a full width at half maximum of between 3 nm and 30 nm, and the red emission a center wavelength between 620 nm and 670 nm and a full width at half maximum of between 3 nm and 30 nm.

Figure 3A:
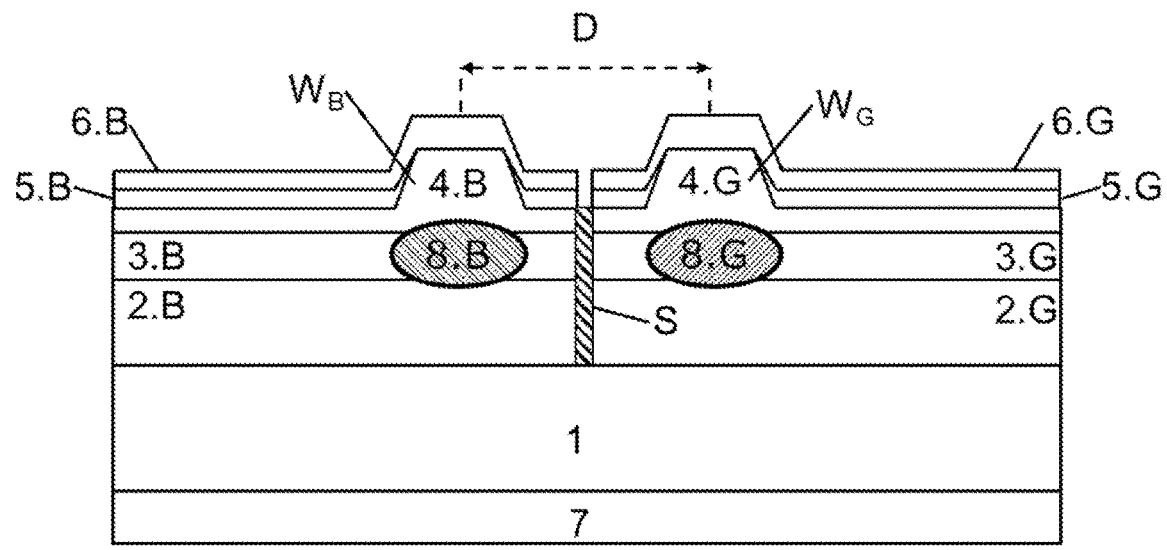
FIG. 3A is a schematic section view of the two-wavelength monolithic SLED device of FIG. 2A after further fabrication steps to create ridges and subsequent deposition on the upper surface of a dielectric layer and p-electrode metallization layer, as well as deposition of an n-electrode metallization layer on the lower surface.

FIG. 3A is a schematic section view of the two-wavelength monolithic SLED structure of FIG. 2A after the further fabrication steps of etching to create ridges W from the stacks. The etching removes at least the exclusion regions, so that the remaining material is of good quality. After etching to create the ridges W, one or more isolating dielectric layers 5 are deposited on the upper surface (front face) followed by one or more p-electrode metallization layers 6 for forming top electrical contacts. In addition, one or more n-electrode metallization layers 7 are deposited on the lower surface (back face) of the substrate 1 for forming bottom electrical contacts.

The blue and green ridges $W_B$, $W_G$ are laterally separated by a distance D and include the upper part of the p-type layer(s) 4, so that lateral waveguiding confinement in regions 8.B, 8.G are created in the active layer(s) 3.B, 3.G. It is noted that the respective optical axes of the waveguiding regions 8.B, 8.G will be separated by the same distance as the ridge separation, i.e. distance D.

In addition, it will be understood that in a direction perpendicular to the plane of the sectional drawing, or an angle tilted away from this perpendicular by up to an amount of perhaps 25 degrees (the physical constraints on the upper limit of the tilt angle are explained below), the wafer is cleaved along one of its crystallographic planes to create front and back facets at each end of the structure which bound the cavity of each SLED. For a GaN wafer, the cleaves may, for example, be perpendicular to the c-plane of the GaN wafer surface and along, i.e. parallel to, the m-plane.

The gap between adjacent blue and green ridges in the monolithic BG SLED chip can be made smaller than 100 µm. Since the width of the exclusion region S is about 5 to 20 µm, since it is only the poor quality material of the exclusion region that is required to be removed, and since the width of each ridge typically needs to be kept above about 1 µm and below about 5 µm, the lateral separation D between adjacent ridges can thus be reduced to between about 10 and 30 µm, considering also process tolerances.

Figure 3B:
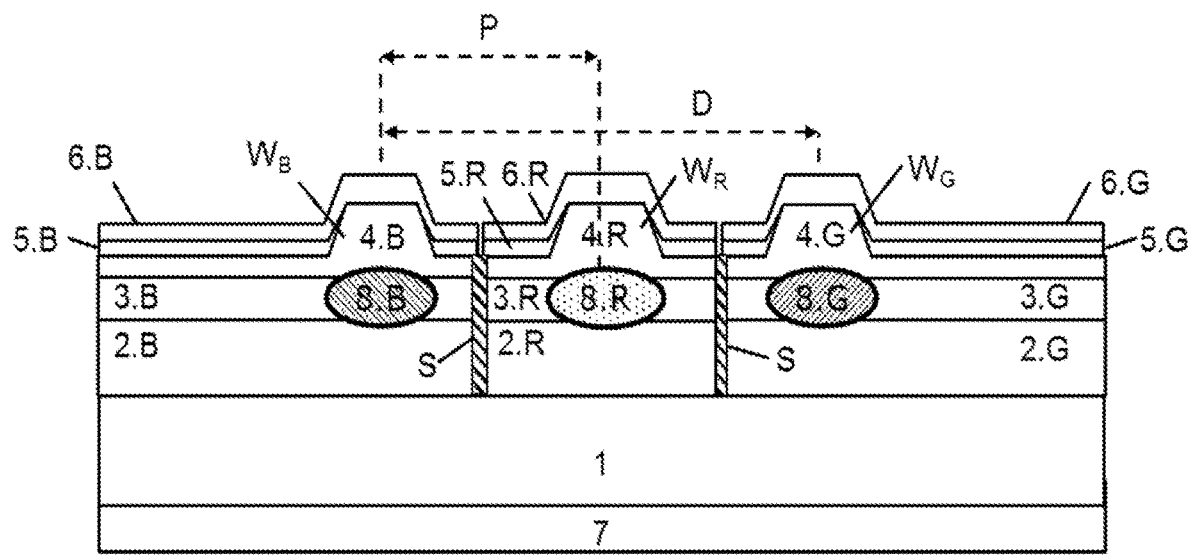
FIG. 3B is a schematic section view of the three-wavelength monolithic SLED structure of FIG. 2B after further fabrication steps to create ridges and subsequent deposition on the upper surface of a dielectric layer and p-electrode metallization layer, as well as deposition of an n-electrode metallization layer on the lower surface.

FIG. 3B is a schematic section view of the three-wavelength monolithic SLED structure of FIG. 2B after the further fabrication steps of etching to create ridges W from the stacks and subsequent deposition on the upper surface (front face) of one or more isolating dielectric layers 5 and one or more p-electrode metallization layers 6 for forming top electrical contacts. In addition, one or more n-electrode metallization layers 7 are deposited on the lower surface (back face) of the substrate 1 for forming bottom electrical contacts. The three wavelengths are labelled as red, green and blue.

The blue, red and green ridges $W_B$, $W_R$, $W_G$ are laterally separated from each other. The blue and red ridges are separated by a lateral distance P (P for Pitch) and the blue and green ridges by a distance D. The red ridge is situated between the blue and green ridges. The ridges W include the upper part of the p-type layer(s) 4, so that for each SLED stack a lateral waveguiding confinement is produced below the ridge W in a region 8 which is vertically situated so as to include the active layer(s) 3. It is noted that the respective optical axes of the waveguiding regions 8.B, 8.R will be separated by the same distance as the P-to-R ridge separation, i.e. distance P and that the respective optical axes of the waveguiding regions 8.R, 8.G will be separated by the same distance as the R-to-G ridge separation, i.e. distance D minus P. In this example, D=2P, i.e. all ridges are laterally equidistant.

In addition, it will be understood that in a direction perpendicular to the plane of the sectional drawing, or an angle tilted away from this perpendicular by up to an amount of perhaps 25 degrees (the physical constraints on the upper limit of the tilt angle are explained below), the wafer is cleaved along one of its crystallographic planes to create front and back facets at each end of the structure which bound the cavity of each SLED. The cleaves may, for example, be perpendicular to the c-plane of a GaN wafer surface and along, i.e. parallel to, the m-plane.

The lateral distance or separation P between adjacent blue and red ridges in the monolithic BRG SLED chip, and the lateral separation D minus P between adjacent red and green ridges, can be made smaller than 100 µm. Since the width of the exclusion region S is about 5 to 20 µm, since it is only the poor quality material of the exclusion region that is required to be removed, and since the width of each ridge needs to be kept above about 1 µm and below about 5 µm, the lateral separation P, or D minus P, between adjacent ridges can thus be reduced to between about 10 and 30 µm, considering also process tolerances.

Figure 4A:
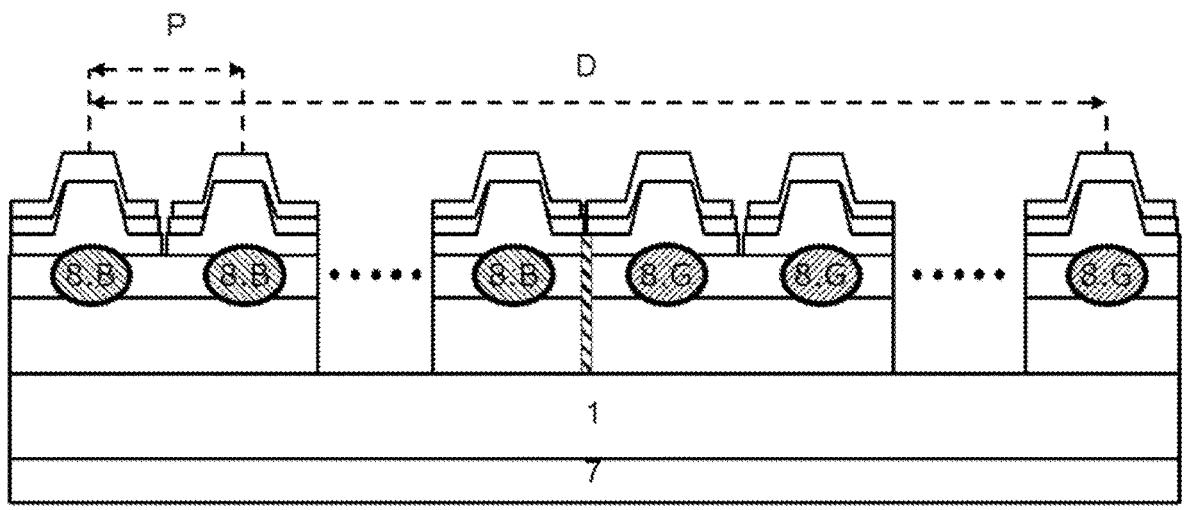
FIG. 4A is a schematic section view of a two-wavelength monolithic SLED device comprising multiple adjacent blue SLED emitters and multiple adjacent green SLED emitters: B-B-B- . . . B-G-G- . . . -G.

FIG. 4A is a schematic section view of a two-wavelength monolithic SLED device comprising multiple adjacent blue emitters and multiple adjacent green emitters. For example, the SLED structure could consist of four blue and four green emitters so that the SLED structure consists of B-B-B-B-G-G-G-G, or five blue and three green emitters so that the SLED structure consists of B-B-B-B-B-G-G-G. Any other desired permutation of a first plural number of adjacent SLEDs of one emission wavelength range and the same or another plural number of adjacent SLEDs of a different emission wavelength range is possible. As shown in FIG. 4A, where like SLED are adjacent, part or at least the lower layers of their layer structures can be grown together in a single epitaxy, i.e. in a single stack.

The ridges of adjacent SLEDs are separated by a lateral distance P. The lateral distance between the first and last ridge in the array is D. Since the lateral distance P between adjacent SLEDs is kept small, the lateral distance D, representing the overall width of the device and also the overall width of the emitted beams, can also be kept comparatively small for a given desired combination of output beams.

Figure 4B:
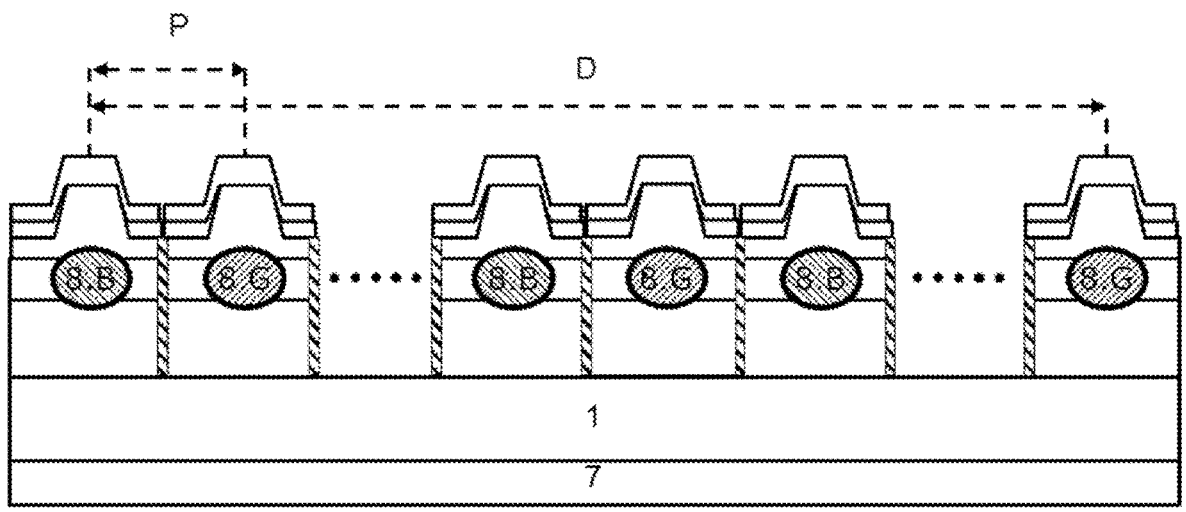
FIG. 4B is a schematic section view of a two-wavelength monolithic SLED device comprising repeat units of an adjacent blue SLED emitter and an adjacent green SLED emitter: B-G-B-G- . . . B-G-B-G . . . , i.e. an array with a single unit consisting of B-G.

FIG. 4B is a schematic section view of a two-wavelength arrayed monolithic SLED device comprising repeat units of an adjacent blue emitter and an adjacent green emitters in the order B-G-B-G-B-G-B-G . . . , i.e. with a single unit consisting of B-G being repeated over multiple periods to form a one-dimensional array.

The ridges of adjacent SLEDs are separated by a lateral distance P. The lateral distance between the first and last ridge in the array is D. Since the lateral distance P between adjacent SLEDs is kept small, the lateral distance D, representing the overall width of the device and also the overall width of the emitted beams, can also be kept comparatively small for a given desired combination of output beams.

Figure 4C:
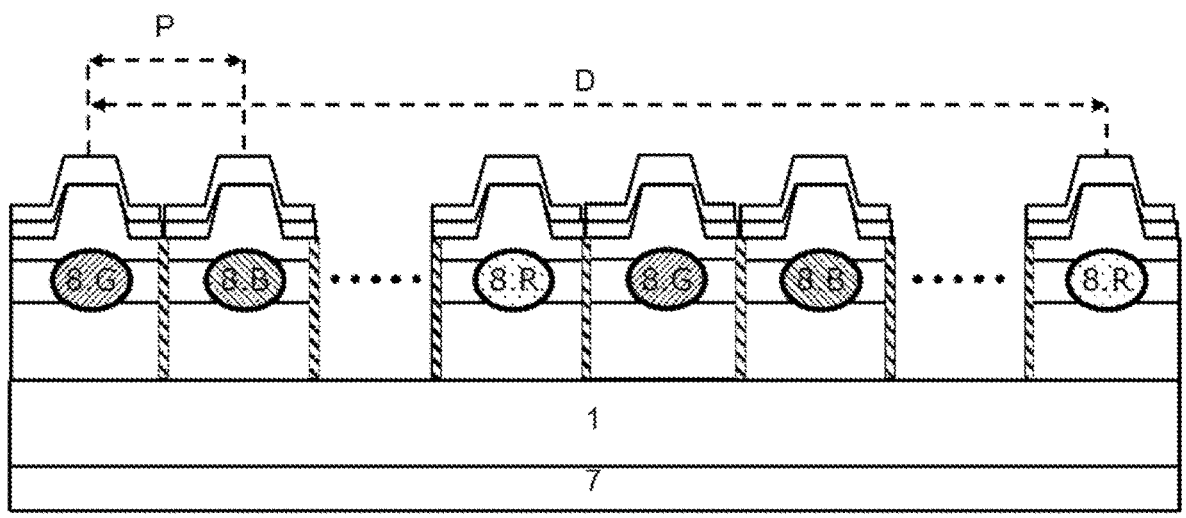
FIG. 4C is a schematic section view of a three-wavelength monolithic SLED device comprising repeat units of adjacent blue, green and red SLED emitters: GB . . . RGB . . . R.

FIG. 4C is a schematic section view of a three-wavelength monolithic SLED device comprising repeat units of adjacent green, blue and red SLED emitters. Each unit thus consists of one green, one blue and one red emitter G-B-R, so that if for example three repeats were provided the SLED structure would be G-B-R-G-B-R-G-B-R.

The ridges of adjacent SLEDs are separated by a lateral distance P. The lateral distance between the first and last ridge in the array is D. Since the lateral distance P between adjacent SLEDs is kept small, the lateral distance D, representing the overall width of the device and also the overall width of the emitted beams, can also be kept comparatively small for a given desired combination of output beams.

Figure 5A:
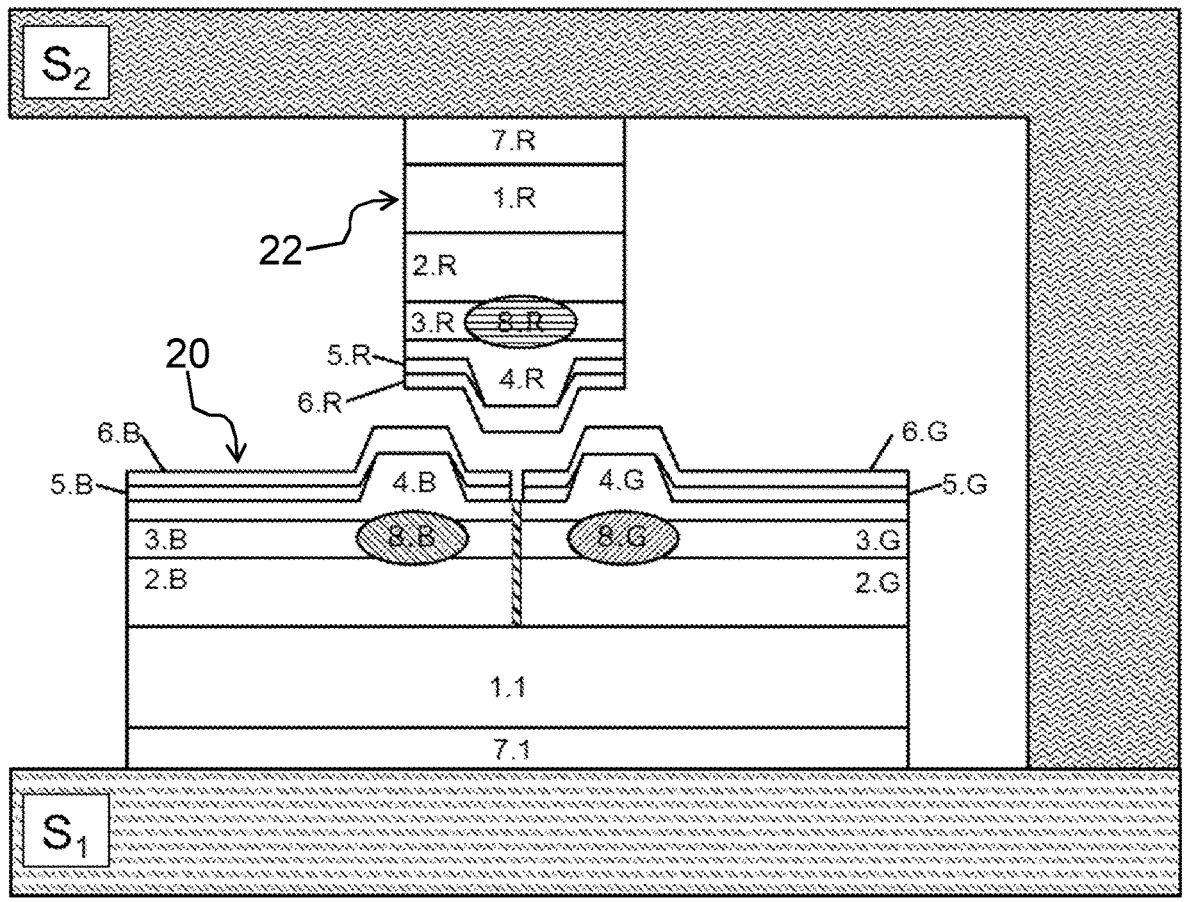
FIG. 5A is a schematic section view of a structure for realizing a compact RGB SLED module.

Although not illustrated, another possibility would be to provide repeat units of multiple red emitters, multiple adjacent blue emitters and multiple adjacent green emitters such as each unit consisting of two red, two blue and two green emitters so that a single unit consists of R-R-B-B-G-G, and this unit is repeated two or more times, e.g. twice to provide an SLED structure: R-R-B-B-G-G-R-R-B-B-G-G FIG. 5A is a schematic section view of a structure for realizing a compact RGB SLED module. The RGB SLED module is based on a two-wavelength range monolithic SLED device 20 with adjacent blue- and green-emitting SLEDs and a one-wavelength range SLED device with a red-emitting SLED. The BG-SLED structure may be fabricated with the nitride-based materials system and the R-SLED structure with either the arsenide- or the phosphide-based materials systems. For the red SLED, the active layers may contain In, Al, Ga, As or In, Al, Ga, P elements. The p-type layers are towards the surface of the device. The n-type layers are buried between the active layers and the substrate. A suitable substrate material is GaAs. Both n-type and p-type layers may contain In, Al, Ga, As or In, Al, Ga, P elements. Corresponding reference numerals for like layers 1, 2, 3, 4, 5, 6 and 7 are used as for the previous structures as well as for the waveguiding region 8. The manner of cleaving to produce the device end faces is also analogous, but taking account of the different crystal structure (zincblende instead of wurtzite).

The monolithic BG SLED device is arranged on a support member or sub-mount S1. The red SLED device is arranged on a support member or sub-mount S2. The support members S1 and S2 are structurally connected to each other so they form a single rigid unit with the R-SLED structure inverted relative to the BG-SLED structure. The connection is such that the principal optical axes of the three waveguide regions 8 of the three SLEDs form a triangle (as viewed in the illustrated front facet section) with the line between the B and G optical axes providing the triangle's base. In addition, the support members S1 and S2 may be thermally connected so that they form a unitary heatsink. Moreover, the support members S1 and S2 may be electrically connected to form a common ground connection. The materials choice for the support members is based not only on structural rigidity, but also suitability as efficient heat dissipators, i.e. the support members preferably have high thermal conductivity to aid device cooling. In a variant the support members are formed integrally as a single piece. One or both of the support members may be cooled, e.g. with Peltier devices, water cooling or forced air cooling.

In FIG. 5A, a gap is shown between the top of the BG-SLED structure and the bottom of the inverted R-SLED structure. The gap is beneficial to aid cooling. The interior of the module may be sealed or may be open to allow forced air cooling past the SLED surfaces. However, in alternative embodiments, the inverted R-SLED structure can be physically bonded to the BG-structure. This could be achieved by applying a layer of bonding material on top of the top contact 6B/G of the BG-SLED structure and/or an equivalent layer on top of the top contact 6R of the R-SLED structure. One of the support members S1 and S2 could then be dispensed with. Alternatively, they could both be retained to aid heat dissipation.

Figure 5B:
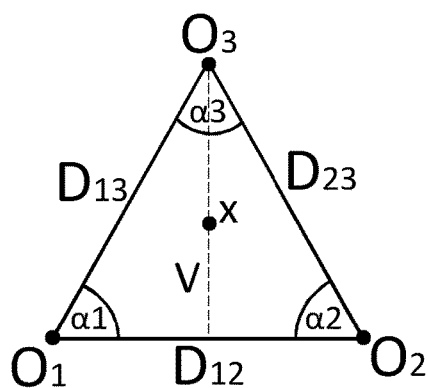
FIG. 5B is a schematic end view of the general geometric arrangement of red, green and blue edge-emitting SLEDs arranged in a triangle as produced by the RGB SLED source module of FIG. 5A.

FIG. 5B is a schematic end view to show the geometric properties of the triangular arrangement of the optical axes of the red, green and blue edge-emitting SLEDs, as produced by the RGB SLED source module of FIG. 5A. Alternatively, instead of an end view, FIG. 5B could be described as a section through the front facet of the BG-SLED device and the front facet of the R-SLED device, bearing in mind this section need not be in a single plane, since the respective front facets of the BG- and R-SLED devices need not be co-planar. It will be understood that the optical axis of each SLED lies in the center of the waveguide region 8 (as viewed in section). The R, G and B optical axes are labelled O1, O2 and O3 respectively. The distance B-to-G is labelled D12. The distance B-to-R is labelled D13. The distance R-to-G is labelled D23. The internal angles $\alpha 1$, $\alpha 2$ and $\alpha 3$ of the triangle are as illustrated. In addition, a vertical V is shown with a dotted line which represents a plane that is perpendicular to the BG wafer/substrate plane and intersects with the optical axis O3, i.e. this is a plumb line from the optical axis O3 to show the vertical intersection with the line connecting O1 and O2.

The most preferred geometrical arrangement is when the triangle is an equilateral triangle (i.e. all internal angles are equal at 60 degrees, and the side length are all equal). Another preferred arrangement is with an isosceles triangle (i.e. two equal internal angles and two equal length sides) with a $1=\alpha 2$ so that the R-optical axis remains midway laterally between the B and G optical axes O1 and O2. Even if the optical axes are not equilateral or isosceles, it is desirable that the R-optical axis O3 lies within the span of the triangle base provided by the BG-optical axes O1 and O2, in which case the triangle would be an acute triangle (i.e. all internal angles $\alpha 1$, $\alpha 2$, $\alpha 3$ are less than 90 degrees) with the R-optical axis being situated part way laterally between the B and G optical axes with unequal lateral distances between O1 and the intersection of V with the line O1 to O2, and the intersection of V with the line O1 to O2 and O2.

In the case of a design using an equilateral triangle, we define this as having been fulfilled when each of the three internal angles have values within 5 degrees of a geometric definition of an equilateral triangle, i.e. 60±5°. In the case of a design using an isosceles triangle, we define this as having been fulfilled when the two nominally equal internal angles $\alpha 1$, $\alpha 2$ are within 5 degrees of the geometric definition which means within 10 degrees of each other, i.e. $|\alpha 1 - \alpha 2| \leq 10°$. In the case of a design using an acute triangle (that is neither equilateral or isosceles), in some examples we impose the additional constraint that the internal angles $\alpha 1$, $\alpha 2$ and $\alpha 3$ are all less than 75 degrees.

As can be seen in FIG. 5A, the inverted R-SLED can approach the gap between the ridges of the BG-SLEDs such that the ridged structures at least partially intermesh. By partially intermesh we mean that the lowest part of the inverted R-SLED device, i.e. its upper ridge surface when viewed the right way up, extends below the highest parts of the non-inverted SLED device, i.e. below a line between the peaks of the B and G ridge surfaces, so that a nominal lateral motion of the R-SLED device would cause it to contact the GB-SLED device. However, it is also the case that in some embodiments the gap, i.e. vertical separation, is sufficiently large that the SLED structures are not even partially intermeshed.

It is desirable for subsequent optical components, such as spherical lenses or equivalent mirrors, that the distances between three optical axes are as small as possible and also that the three optical axes approximate as closely as possible to an equilateral triangle arrangement so that they are symmetrically disposed around a central axis x which can be used as the optical axis of the subsequent optical components. In section, the point x can be defined as the center point of an equilateral triangle about which there is 3-fold rotational symmetry for the equilateral triangle. (In the case of an isosceles triangle point x can be defined as lying on line V and bisecting line V into two equal length portions.)

It is desirable to minimize the absolute distance between the optical axes which can be achieved by arranging the inverted R-ridge at or close to midway between the monolithically fabricated "right-way-up" G- and B-ridges so that the distance of line V is as short as possible. Since the ridges approach in the manner of gear teeth about to mesh, the minimum practical vertical distance can be achieved when the inverted ridge is in the gap, preferably at or near the middle of the gap, between the two right-way-up ridges. Whatever the minimum achievable vertical separation, i.e. length of line V, the fabrication of the two-wavelength range monolithic SLED structure can be done so that the distance O1 to O2 (i.e. distance D of FIG. 3A) is equal to that minimum achievable vertical separation, so that an equilateral triangle with the shortest achievable side lengths is produced.

Side lengths D13 and D23 of less than 100 μm are achievable, so that equilateral triangle geometric arrangements of the optical axes are achievable with all three side lengths, including the B-to-G distance O1 to O2, less than 100 μm. The B-to-G distance D12 (corresponding to the previously defined distance P) can be kept below 100 μm, 90 μm, 80 μm, 70 μm, 60 μm, 50 μm, 40 μm or 30 μm and may be as low as 10 μm, 20 μm or 30 μm. The vertical distance V can be below 100 μm, 90 μm, 80 μm, 70 μm or 60 μm and may be as low as 50 μm, 60 μm or 70 μm.

Figure 5C:
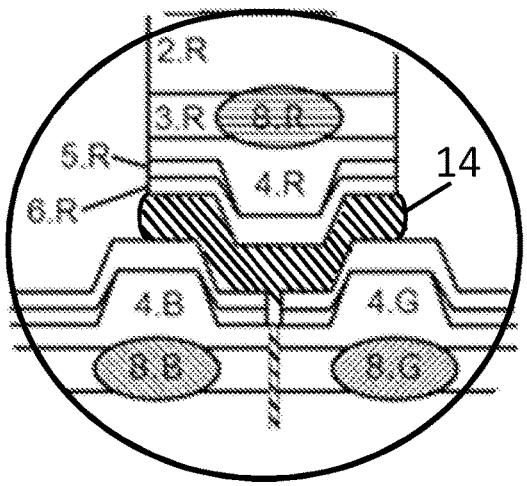
FIG. 5C is an inset from FIG. 5A showing a variant construction with the inverted red SLED structure bonded to the blue-green SLED structure via a thermally conductive and electrically insulating layer.

FIG. 5C is an inset from FIG. 5A showing a variant construction with the inverted R-SLED structure bonded to the BG-SLED structure via a layer 14 which is preferably a good thermal conductor to carry heat away during operation, and is also electrically inactive in the structure, for example formed of an insulating material. This could be achieved by applying a layer of bonding material on top of the top contact 6B/G of the BG-SLED structure and/or an equivalent bonding layer on top of the top contact 6R of the R-SLED structure. An example realization can follow the approach disclosed in US2010080001A1 (Sanyo Electric Co Ltd) for the embodiment of FIG. 8 of that document. One of the support members S1 and S2 could then be dispensed with. Alternatively, both support members may be retained for their heat dissipation function. In the case of the variant module construction shown in FIG. 5C, the vertical distance V can be below 100 μm, 90 μm, 80 μm, 70 μm, 60 μm or 50 μm and may be as low as 10 μm, 20 μm, 30 μm or 40 μm.

The proposed module of FIGS. 5A and 5B is particularly suitable for use as a source in compact wearable projection systems, such as glasses (i.e. spectacles) or a visor, as described for example in US 2015/0103404 A1. The red, green and blue emitting sources are closely spaced allowing simplified and compact collimating optics (e.g. single micro-lens) and scanning element design (if any; e.g. direct retina projection)

Figure 6A:
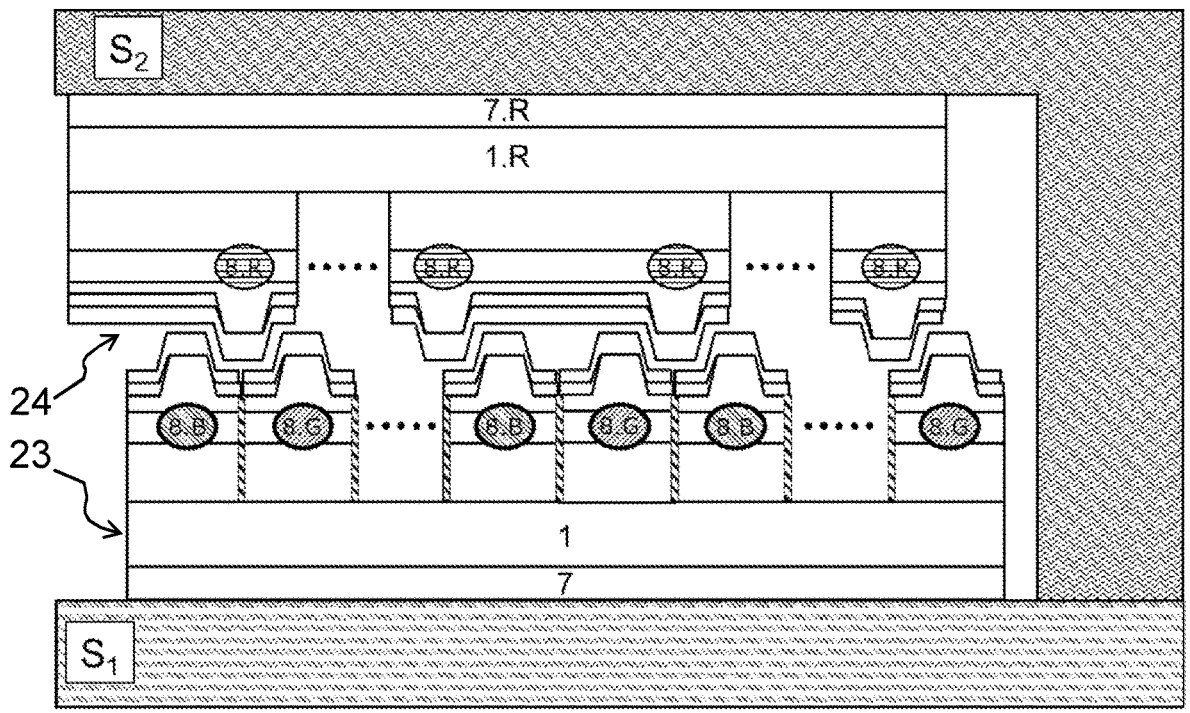
FIG. 6A is a schematic section view of a structure for realizing a compact one-dimensional array of RGB SLEDs into a module.

FIG. 6A is a schematic section view of a structure for realizing a compact one-dimensional array of RGB SLEDs into a module. A two-wavelength range monolithic SLED device 23 with adjacent blue and green emitting SLEDs is provided as shown in FIG. 4B. In addition, a one-wavelength range SLED device 24 with adjacent red emitting SLEDs is provided. The lateral separation of adjacent ridges (or adjacent optical axes) in the one-wavelength, i.e. red SLED structure is matched to the lateral separation between adjacent SLEDs of like color in the two-wavelength SLED structure, so that the module can be assembled with the SLEDs being in triangular groups of three: one red, one blue and one green, so that a succession of RGB-triangles, each with the same relative juxtaposition as shown in FIG. 5B is achieved. The triangles are arranged in a common plane parallel to and part way between the wafer planes of the two SLED structures.

Figure 6B:
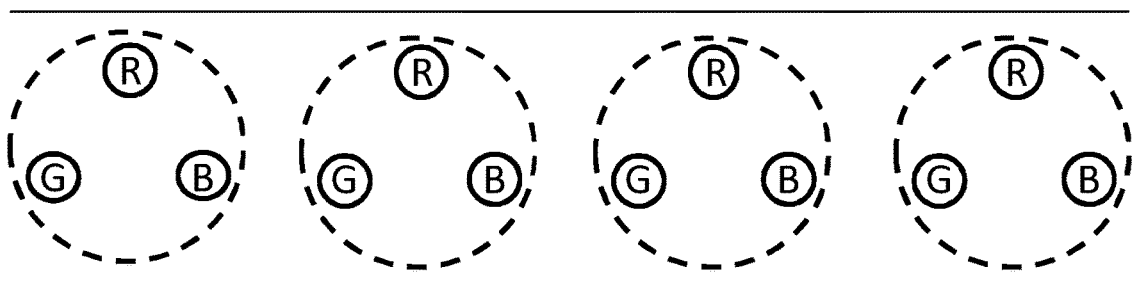
FIG. 6B is a schematic end view of the general geometric arrangement of red, green and blue edge-emitting SLEDs arranged in a one-dimensional array as produced by the RGB SLED source module of FIG. 6A.

FIG. 6B is a schematic end view of the general geometric arrangement of red, green and blue edge-emitting SLEDs arranged in a one-dimensional array as produced by the RGB SLED source module of FIG. 6A. (The dotted circles are merely a visual cue to highlight the line of RGB-SLED groups.) It will also be understood that the lateral separation between the groups need not be equal to the lateral separation between SLEDs of like color as in the illustration. It is possible for these dimensions to be different so that adjacent RGB-SLED groups are moved wider apart or closer together than as illustrated.

The proposed module of FIGS. 6A and 6B is particularly suitable for digital amplitude modulation purposes. For a SLED array with a plurality of 'x' single SLED emitters, the first SLED in the array is operated at constant output power $P_0$, the second SLED in the array is operated at a constant power $P_0/2$, the third at $P_0/4$, the $x^{th}$ SLED is operated at $P_0/2^x$. The possible discrete power levels are $2^x$ (x-bit modulation).

A variant of FIG. 6A would be to make a compact one-dimensional array of SLEDs by arranging two of the structures shown in FIG. 4A, 4B or 4C together with one inverted and the other the right way up. In this case, the lateral ridge separation distance P would be the same in both the inverted and 'right-way-up' structures.

We now describe in more detail various designs for the SLEDs.

Standard SLED devices are designed to operate in a regime of amplification of the spontaneous emission without reaching lasing operation.

The output power from the front facet side of a SLED at a given current can be written as:

$$Pout \sim Ps \cdot \frac{1 + G_0(L) \cdot R_b}{1 - G_0^2(L) \cdot R_b \cdot R_f} \cdot (G_0(L) - 1) \cdot (1 - R_f)$$

where Ps is the spontaneous emission power coupled into the propagating optical mode, Rb and Rf are the back and the front facet reflectivities and $G_0(L)$ is the SLED single pass gain:

$$G_0(L) = \exp((\Gamma g - \alpha_i) \cdot L)$$

where $\Gamma$ is the modal confinement factor, g the peak material gain, $\alpha_i$ the internal loss, and L the chip waveguide length.

For a SLED to operate in a light amplification regime without achieving lasing the following conditions must be satisfied:

$\Gamma g > \alpha_i$ (amplified spontaneous emission regime)

$G_0^2(L) \cdot R_b \cdot R_f \ll 1$ (lasing condition is reached at unity)

The conditions needed to suppress lasing can be achieved by appropriate design of the cavity. In particular, it is important to avoid undesired multiple passes through the cavity, which can be supported by avoiding light backscattered from the end facets, e.g. by reflection, coupling back into the SLED waveguides.

When both facet reflectivities are negligible ($R_f = R_b \approx 0$) $P_{out}$ becomes:

$Pout \sim Ps \cdot (G_0(L) - 1)$

In this case the SLED design is called a single-pass design.

When the back-facet is highly reflective (e.g. $R_b \approx 100\%$) and the front-facet reflectivity is negligible (($R_f \approx 0$) $P_{out}$ becomes:

$Pout \sim Ps \cdot (G_0^2(L) - 1)$

In this case the SLED design is called double-pass design.

The output facet losses can be increased by implementing the following elements/solutions in the SLED chip design:
a) antireflection coatings
b) tilted waveguides
c) part-curved waveguides
d) passive absorber sections.

Combinations of any of these measures are also possible. Some examples of implementing one or more of these options are now described in more detail.

The gain section is electrically injected with carriers via injection electrodes. Light is thus generated and then amplified as it travels along the waveguide. The passive absorber section shares with the gain section the same epitaxial layer sequence (p- and n-layers; active layers) and is geometrically defined on the chip during the device fabrication process. The passive absorber section may share with the gain section a ridge waveguide structure or not. Embodiments with no ridge waveguide in the absorber section can be realized by etching down the top cladding and waveguiding layers in the absorber section during the fabrication process. In contrast to the gain section, the passive absorber section is not electrically injected, its purpose being to absorb light and prevent the guided optical radiation to reach the back facet and being coupled again into the gain section. In the case of the absorber section sharing a ridge waveguide with the gain section, the waveguide part falling in the absorber section may also share with the gain section the electrical isolation layer 5 and may include a top metallic contact layer which is electrically separated and independent from the top metallic contact layer 6 in the gain section. In the case of the passive absorber section sharing a ridge waveguide with the gain section and implementing a top metallic contact layer, the absorber top contact layer may be electrically floating, connected to ground or maintained in reverse bias during operation.

Figure 7A:
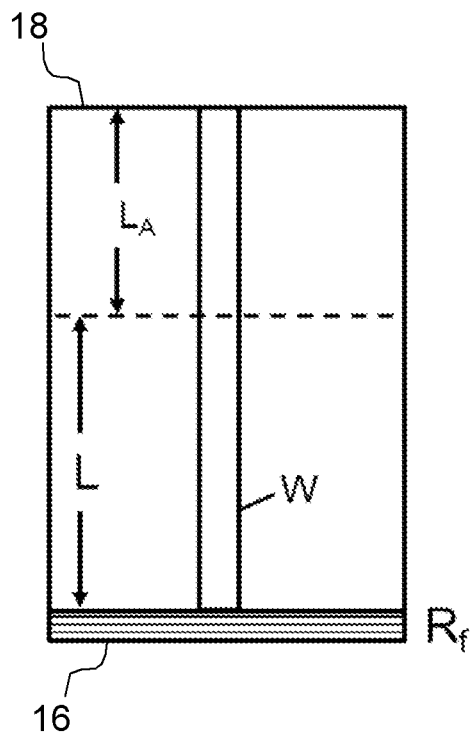
FIG. 7A is a schematic plan view of a first example SLED designed for single pass with a straight ridge waveguide extending perpendicular to the end facets of the chip and over the full length of the chip from back facet to front facet, and a passive absorber which includes a portion of the ridge.

FIG. 7A is a schematic plan view of a first example SLED designed for single pass with a straight ridge waveguide W extending perpendicular to the front and rear end facets 16, 18 of the chip and over the full length of the chip from back facet to front facet, and a passive absorber which includes a portion of the ridge.

Figure 7B:
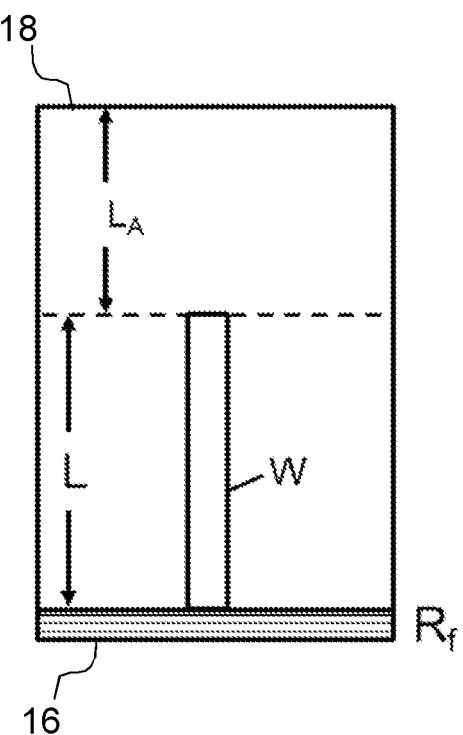
FIG. 7B is a schematic plan view of a second example SLED designed for single pass with a straight ridge waveguide extending perpendicular to the end facets of the chip and over a first part of the length of the chip from the front facet to part way towards the back facet and a passive absorber extending over a second part of the length of the chip to the back facet.

FIG. 7B is a schematic plan view of a second example SLED designed for single pass with a straight ridge waveguide W extending perpendicular to the front and rear end facets 16, 18 of the chip and over a distance L covering a first part of the length of the chip from the front facet to part way towards the back facet and a passive absorber extending over a distance $L_A$ covering a second part of the length of the chip from the chip interior end of the waveguide to the back facet. In the design of FIG. 7B, the cavity's optical path between the front and back facets is thus partly through the waveguide and partly outside the waveguide in contrast to the design of FIG. 7A in which the cavity's optical path is entirely within the waveguide.

Figure 7C:
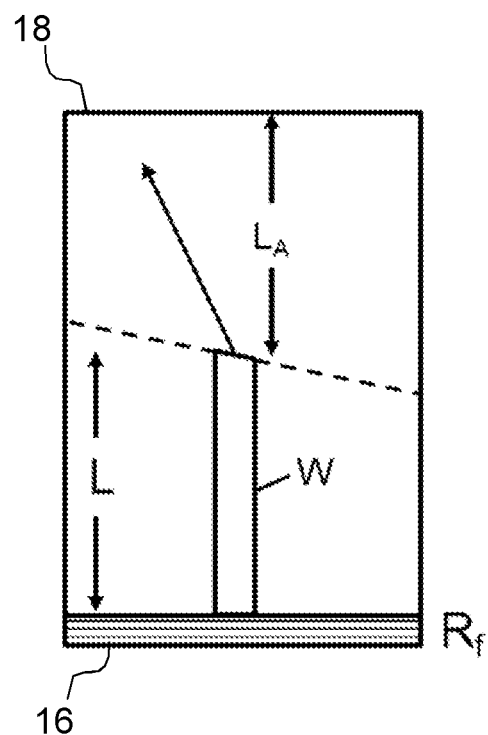
FIG. 7C is a schematic plan view of a third example SLED designed for single pass similar to FIG. 7B, but with the waveguide terminating at a tilt at its internal end proximal the passive absorber region to further suppress reflections from the back facet of the chip.

FIG. 7C is a schematic plan view of a third example SLED designed for single pass similar to FIG. 7B, but with the chip interior end of the waveguide terminating at a tilt proximal to its interface with the passive absorber, wherein the tilt serves to further suppress reflections from the back facet 18 of the chip being coupled back into the waveguide.

FIGS. 7A, 7B and 7C are examples of single-pass designs in which both facet reflectivities are negligible, i.e. kept as low as possible, and the light is amplified along the waveguide on a single pass. These examples also have in common that the ridge and hence the underlying waveguide W is straight. Back reflection is suppressed by introducing a back passive absorber section of length $L_A$ in the chip design (FIG. 8). Length L is the length over which the chip is driven to inject carriers with suitable drive electrodes, whereas length $L_A$ is the length over which the chip is unbiased or reverse biased with suitable biasing electrodes to support the function of the passive absorber material. The ridge and hence the waveguide may or may not (see FIG. 7A and FIG. 7B respectively) extend over the passive absorber section. The passive absorber section is not subject to electrical carrier injection and should not reach transparency, i.e. photobleaching should be avoided, since otherwise the absorption function of the passive absorber section will be compromised. The passive absorber section absorbs unwanted light traveling backwards in the chip after reflection from the back facet. In the case of a passive absorber without a ridge waveguiding structure, like that of FIG. 7B, the boundary interface (dashed line) between the active waveguiding section and the passive absorber section can be made tilted to further reduce possible reflections at the back facet as shown in FIG. 7C. Here the light emitted from the waveguide into the passive absorber section is emitted at an angle from the waveguide as a result of the tilt. The front facet is covered with a dielectric coating having low reflectivity Rf, i.e. an anti-reflection coating (ARC), in order to suppress light feedback from the front facet from which the light is output.

Figure 7D:
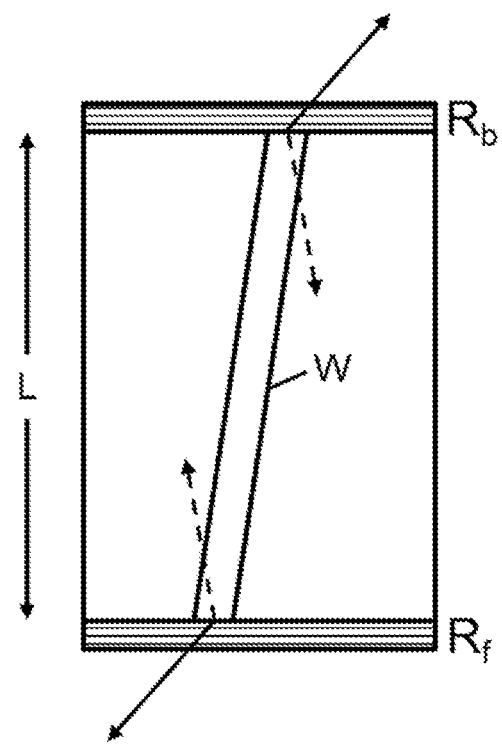
FIG. 7D is a schematic plan view of a fourth example SLED designed for single pass with a straight ridge waveguide extending tilted at an angle to the end facets of the chip, the tilt angle 't' being less than the critical angle for total internal reflection, e.g. $0 < t \leq 25°$.

FIG. 7D is a schematic plan view of a fourth example SLED designed for single pass with a straight ridge waveguide extending tilted at an angle over the full distance between the end facets of the chip. The tilt angle 't' is less than the critical angle for total internal reflection, e.g. $0 < t \leq 25°$, since otherwise the output would not be possible. Solid arrows show the output direction, noting that there is output from both end facets of the chip. Dashed arrows show the direction of internal reflections, which it can be seen are lost from the waveguide and so will not result in multi-pass traversals between the facets which could induce lasing. The amount of reflected light at the end faces which is coupled back into the SLED chip can be further reduced by applying AR coatings on at least one, preferably both, of the end faces. Both facet reflectivities Rf, Rb are made as low as possible and the light is amplified along the waveguide in a single pass.

Figure 7E:
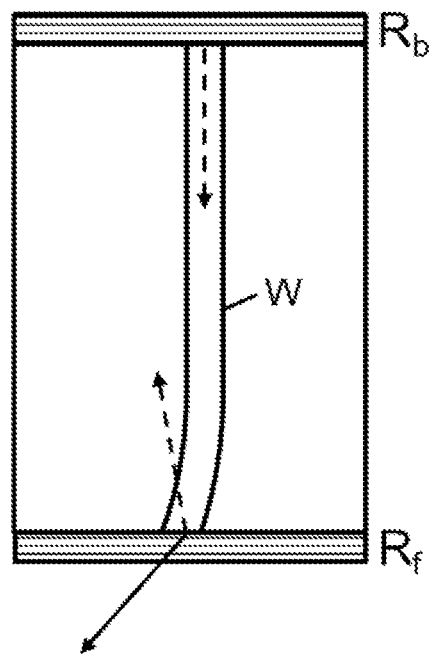
FIG. 7E is a schematic plan view of a fifth example SLED designed for double pass with a ridge waveguide which has a straight portion extending perpendicular to the end facets of the chip from the back facet to some distance away from the front facet and a curved portion extending over the remaining distance to the front facet so that the ridge waveguide meets the front facet at a tilt angle 't' which is less than the critical angle for total internal reflection from the front facet, e.g. $0 < t \leq 25°$.

FIG. 7E is a schematic plan view of a fifth example SLED designed for double pass with a ridge waveguide which has a straight portion extending perpendicular to the end facets of the chip from the back facet to some distance away from the front facet and a curved portion extending over the remaining distance to the front facet so that the ridge waveguide meets the front facet at a tilt angle 't' away from perpendicular which is less than the critical angle for total internal reflection from the front facet, e.g. 0<t≤25°. The critical angle is a function of the material. For example, GaN has a critical angle approximately 24°; GaAs and InP have a critical angle approximately 15° to 17°. Alloys of these materials have other values.

With a double-pass design of this kind, the back-facet reflectivity cannot be neglected. The light propagating towards the back direction is amplified once and then, after undergoing reflection at the back facet, undergoes further amplification when traveling towards the front facet. The SLED chip has a ridge waveguide W which has a straight section extending from the back facet (which is reflective to achieve double pass) and a curved section extending from the front facet (where the output occurs) so that the curve results in the waveguide intersecting with the front facet at a non-perpendicular, tilted angle, i.e. with a non-normal incidence. The back, reflecting facet has a high reflection (HR) coating to maximize the amount of light reflected back into the waveguide at the back facet of the chip. The amount of light coupled back into the SLED cavity at the front facet is suppressed by the waveguide meeting the front facet at an angle, this tilt angle away from perpendicular being e.g. 0<t≤25°. The onset of lasing can be further shifted by providing an AR coating on the front facet.

From the examples of FIGS. 7A to 7E, further permutations combining elements of one or more of these examples will be readily envisaged.

We now describe various designs of monolithic SLED in terms of their cavity design.

All the designs described below are of monolithic, two-emission wavelength range SLED chips, specifically BG-SLED chips. However, it will be readily understood how to extend these designs to monolithic, three emission wavelength range SLED chips, e.g. RGB-SLED chips. It will also be readily understood how to extend these designs to ones incorporating arrays and other repeat sequences as discussed above with reference to FIGS. 4A, 4B, and 4C.

Figure 8A:
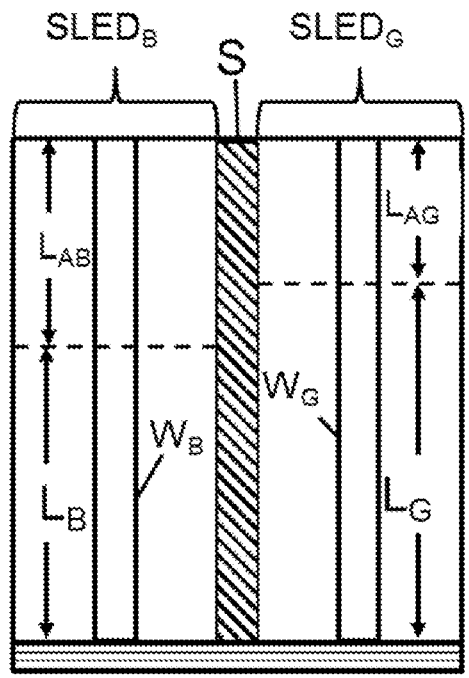
FIG. 8A is a schematic plan view of an example SLED device with blue and green SLEDs, the two SLEDs being designed as shown in FIG. 3A in combination with FIG. 7A.

FIG. 8A is a schematic plan view of an example SLED device with blue and green SLEDs, the two SLEDs being designed as shown in FIG. 3A in combination with FIG. 7A.

Figure 8B:
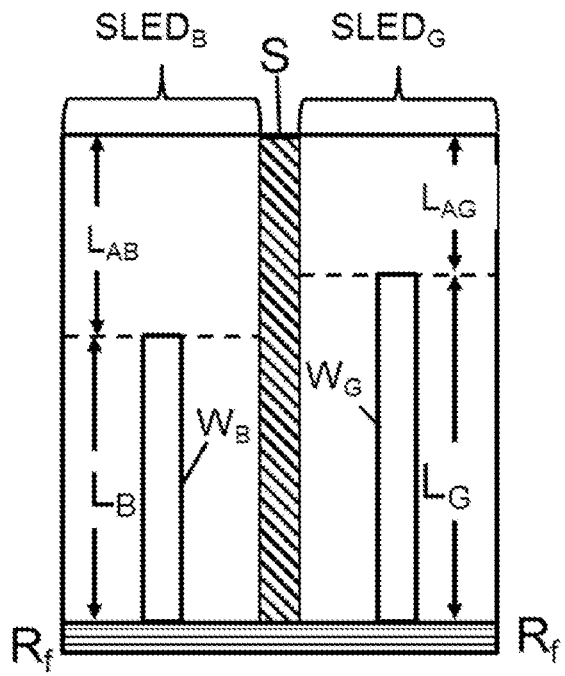
FIG. 8B is a schematic plan view of an example SLED device with blue and green SLEDs, the two SLEDs being designed as shown in FIG. 3A in combination with FIG. 7B.

FIG. 8B is a schematic plan view of an example SLED device with blue and green SLEDs, the two SLEDs being designed as shown in FIG. 3A in combination with FIG. 7B.

Figure 8C:
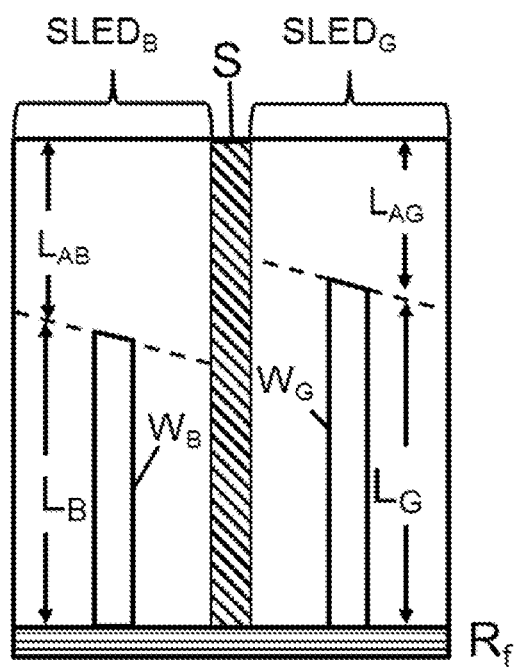
FIG. 8C is a schematic plan view of an example SLED device with blue and green SLEDs, the SLEDs being arranged and configured as shown in FIG. 3A in combination with FIG. 7C.

FIG. 8C is a schematic plan view of an example SLED device with blue and green SLEDs, the SLEDs being arranged and configured as shown in FIG. 3A in combination with FIG. 7C.

FIGS. 8A, 8B and 8C show single-pass designs with both front and back facets having low reflectivity and the light being amplified along the waveguide on a single pass. The SLED monolithic chip in all three examples has first and second adjacent waveguides WB and WG for blue and green emission separated by an exclusion region S. The passive absorber sections for blue and green have in general different lengths as illustrated, the blue absorber length being labelled $L_{AB}$ and the green absorber length being labelled $L_{AG}$. The injected lengths of the waveguides are labelled $L_B$ and $L_G$ respectively for blue and green are also different from each other in consequence, although the drive electrodes could be made shorter than the lengths $L_B$ and/or $L_G$ if desired. Other details of the designs shown in FIGS. 8A, 8B and 8C are the same as described in relation to FIGS. 7A, 7B and 7C respectively.

FIG. 8D1 is a schematic plan view of an example SLED device with blue and green SLEDs, the SLEDs being arranged and configured as shown in FIG. 3A in combination with FIGS. 7A and 7D.

FIG. 8D2 is a schematic plan view of an example SLED device with blue and green SLEDs, the SLEDs being arranged and configured as shown in FIG. 3A in combination with FIGS. 7B and 7D. The passive absorber sections for blue and green have in general different lengths as illustrated, the blue absorber length being labelled $L_{AB}$ and the green absorber length being labelled $L_{AG}$. The injected lengths of the waveguides are labelled $L_B$ and $L_G$ respectively for blue and green are also different from each other in consequence, although the drive electrodes could be made shorter than the lengths $L_B$ and/or $L_G$ if desired.

Figure 8E:
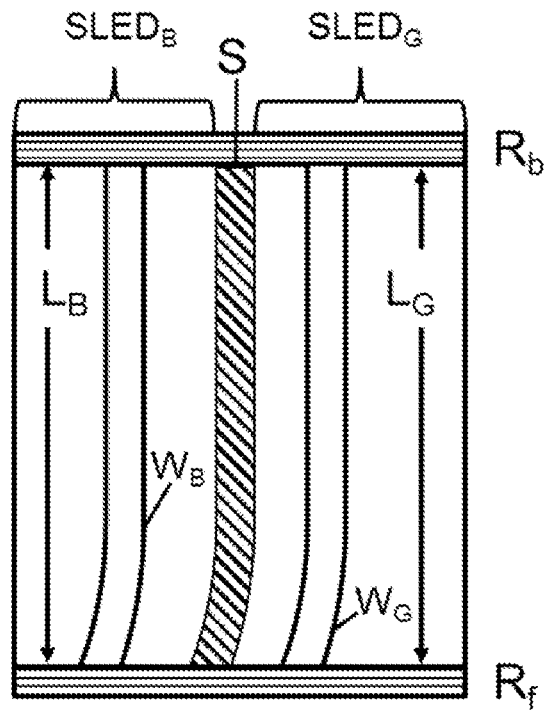
FIG. 8E is a schematic plan view of an example SLED device with blue and green SLEDs, the SLEDs being arranged and configured as shown in FIG. 3A in combination with FIGS. 7A and 7E.

FIG. 8E is a schematic plan view of an example SLED module with blue and green SLEDs, the SLEDs being arranged and configured as shown in FIG. 3A in combination with FIGS. 7A and 7E. It will be understood that the curved sections for blue and green could be the same or different and, if different, may result in different tilt angles at their intersection with the front (output) facet.

Figure 8F:
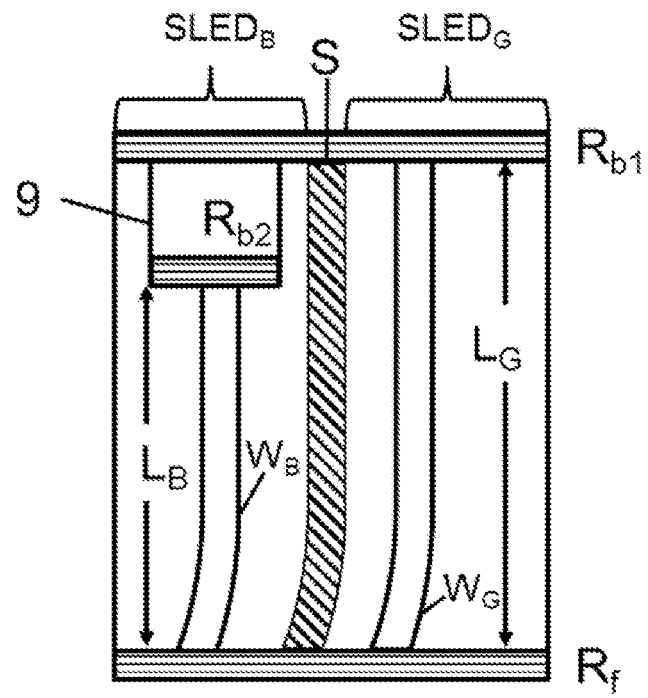
FIG. 8F is a schematic plan view of a variant of FIG. 8E with the blue waveguide having a smaller length, i.e. being shorter, than the green waveguide.

FIG. 8F is a schematic plan view of a variant of FIG. 8E with the blue waveguide having a smaller length, i.e. being shorter, than the green waveguide. In this design, one of the waveguide lengths $L_B$ is shorter than the other $L_G$. As a result, $L_B$ is shorter than the chip length. To accommodate this, the back facet is locally etched down with an etch pit 9 with a planar base surface parallel to and offset from the back facet. An HR coating is applied to the recessed, planar base surface.

FIG. 9A shows the same blue and green P-up SLED device as FIG. 8E both in plan view (as FIG. 8E) and section view (as FIG. 3A).

FIG. 9B1 shows in plan and front facet section views a P-up SLED for red emission, wherein the curved portion of its ridge waveguide has the opposite sense of tilt to the blue and green SLED structure of FIG. 9A, such that the red output beam will have the same output direction (see arrows indicating output propagation direction) as the blue and green beams when the red SLED is flipped over for integration with the blue and green SLED.

FIG. 9B2 is another view of the red SLED of FIG. 9B1 in which the upper, section view is rotated 180 degrees around an axis perpendicular to the section, and the lower, plan view is correspondingly changed with the hidden ridge on the underside of the plan view being shown with dotted lines.

Some examples of epitaxial growth of a monolithic multiple wavelength nitride-based SLEDs according to embodiments of the invention are now described with reference to FIGS. 10, 11 and 12. Each figure shows a succession of schematic section views as the fabrication progresses, the sequence being illustrated with connecting arrows. These monolithic multiple wavelength nitride-based SLED semiconductor epitaxial structures can be grown by metal organic vapor phase epitaxy (MOVPE), molecular beam epitaxy (MBE) or other suitable techniques. The envisaged wafer, i.e. substrate, material is GaN.

Figure 10:
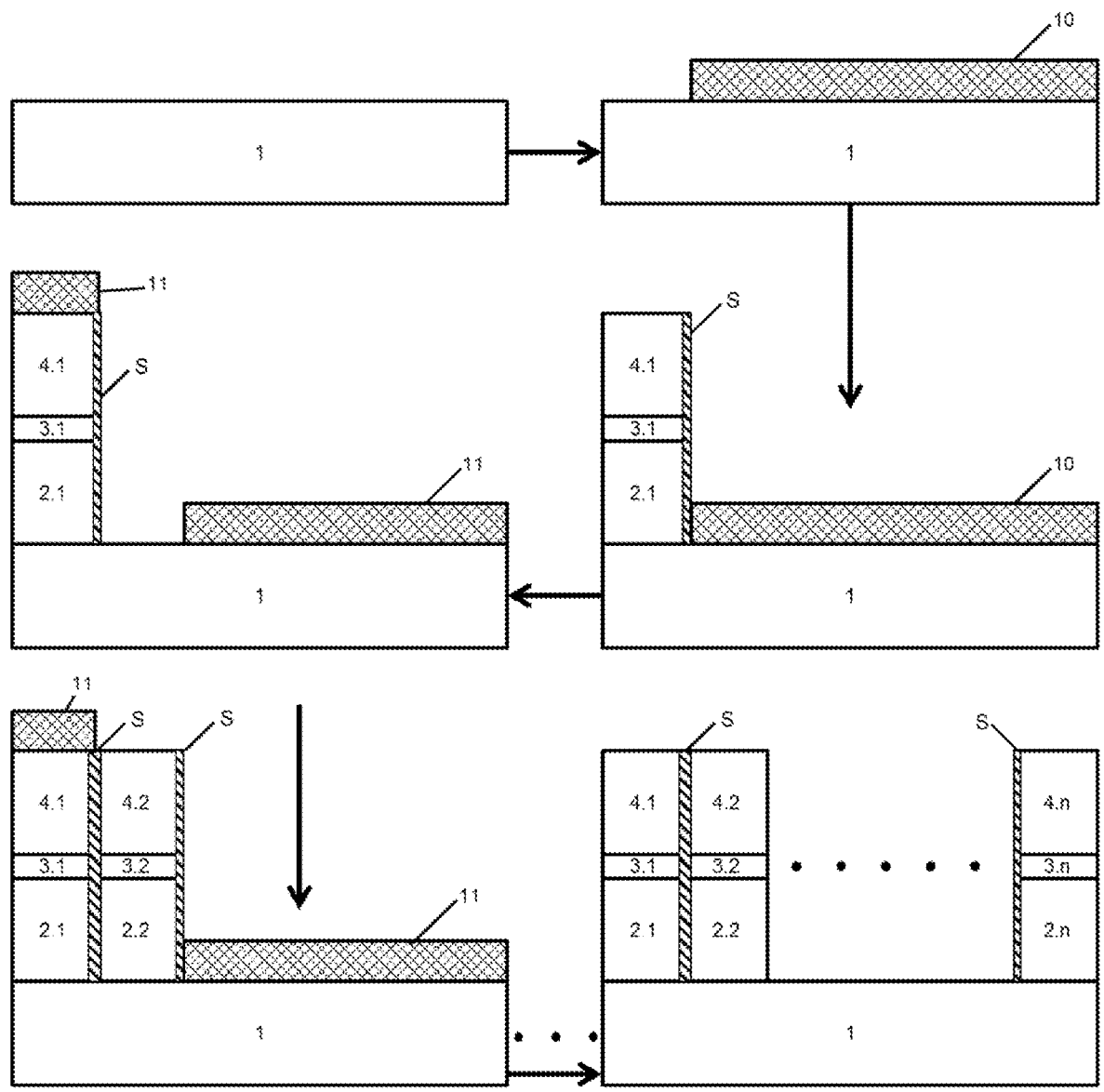
FIG. 10 shows steps of a first example fabrication method for producing a monolithic SLED device by epitaxial growth up to a semi-finished state corresponding to the state shown in FIG. 1 and FIGS. 2A and 2B prior to etching between the stacks.

FIG. 10 shows steps of a first example fabrication method for producing a monolithic SLED device by epitaxial growth up to a semi-finished state corresponding to the state shown in FIG. 1 and FIGS. 2A and 2B prior to etching between the stacks.

The sequence of FIG. 10 uses selective area growth.

A supporting GaN wafer 1 is provided.

The GaN wafer 1 is locally shaded with a first mask 10, which is preferably a dielectric, to prevent subsequent growth in the locally masked areas.

A first layer stack comprising in order of deposition: n-layer(s) 2.1; active layer(s) 3.1; and p-layer(s) 4.1 is deposited to form a first light emitting SLED structure having an emission wavelength range characterized by a center wavelength $\lambda_1$ and bandwidth $\Delta\lambda_1$ (or alternatively a wavelength range $\lambda_{1-MIN}$ to $\lambda_{1-MAX}$). An exclusion region S is formed at boundaries of the first SLED region and the first mask 10.

The first mask 10 is removed and a second mask 11, also preferably dielectric, is deposited to mask both the first SLED structure and part of the supporting wafer not including a strip adjacent the first layer stack, which is left free for growth of the next layer stack.

A second layer stack comprising in order of deposition: n-layer(s) 2.2; active layer(s) 3.2; and p-layer(s) 4.2 is deposited to form a second light emitting SLED structure having an emission wavelength range characterized by a center wavelength $\lambda_2$ and bandwidth $\Delta\lambda_2$. The exclusion region between the first and second stacks is now thicker than previously as a consequence of growing the second stack. Moreover, a further exclusion region is formed at the boundaries of the second SLED structure, the first SLED structure and the second mask 11.

The above steps are iterated 'n' times to form a monolithic multiple wavelength nitride-based SLED device having 'n' light emitting SLED structures, each emitting at a desired design wavelength range, e.g. as defined by center wavelength $\lambda_n$, wherein two or more of the 'n' SLED structures may be designed to have the same emission characteristics, e.g. by being copies of each other, but wherein the 'n' SLEDs collectively are designed to have at least two different emission characteristics, e.g. a blue emission range and a green emission range.

A variant of the above first example fabrication method involves depositing the first layer structure over the whole substrate area, and then removing the unwanted areas by masking and selective etching to leave a stack for the first SLED structure as shown in the third sectional depiction of FIG. 10 (but without the mask material 10). Then selective area growth is performed over the etched area to fabricate the epitaxial layers for the second SLED structure. The unwanted areas are then removed by masking and selective etching to leave a stack for the second SLED structure adjacent the first SLED structure as shown in the fifth sectional depiction of FIG. 10 (but without the mask material 11). These deposition, masking and selective etching steps can then be repeated 'n' times to arrive at the same final structure as shown in the sixth sectional depiction of FIG. 10.

Figure 11:
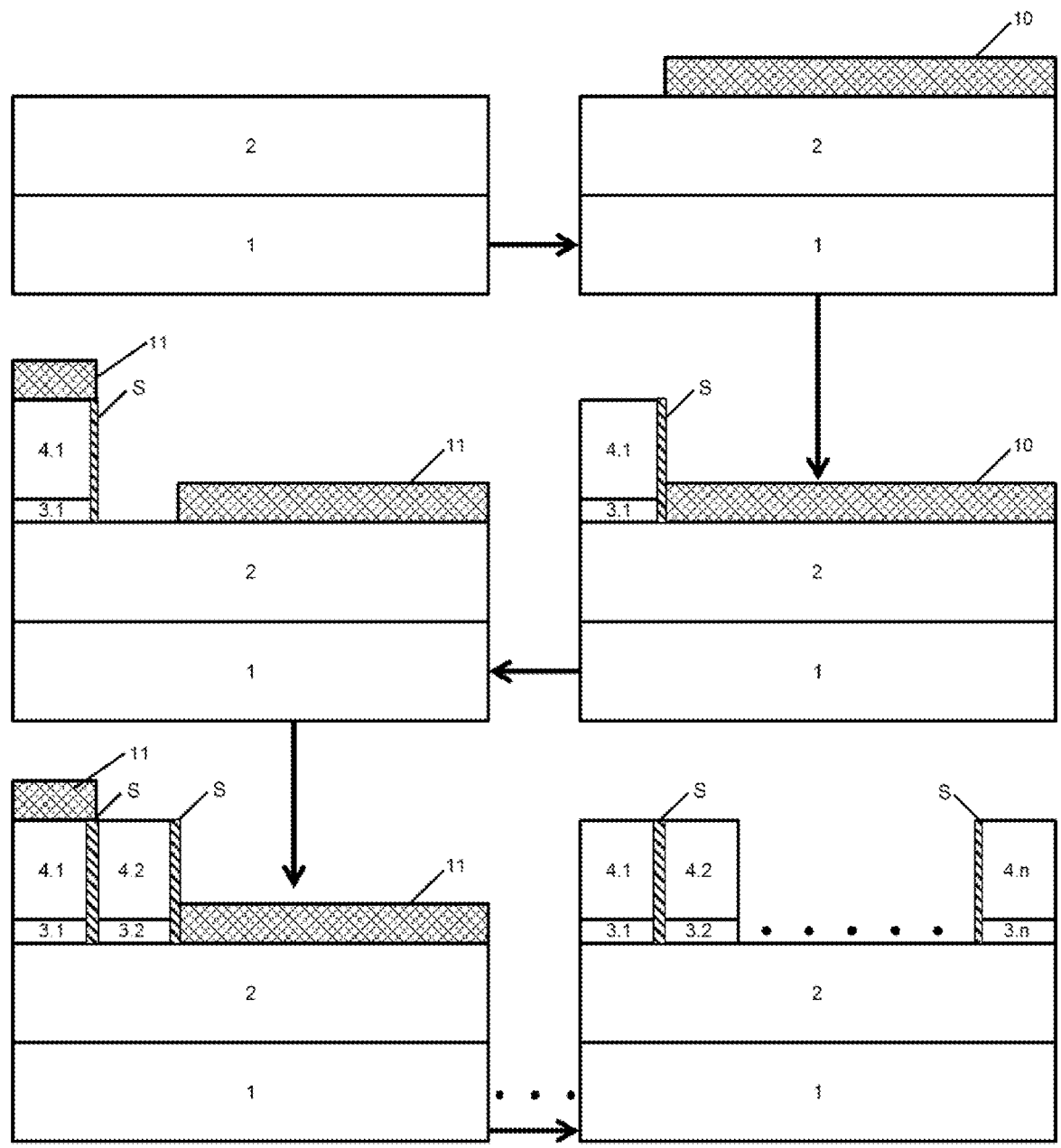
FIG. 11 shows steps of a second example fabrication method for producing a monolithic SLED device by epitaxial growth up to a semi-finished state corresponding to the state shown in FIG. 1 and FIGS. 2A and 2B prior to etching between the stacks.

FIG. 11 shows steps of a second example fabrication method for producing a monolithic SLED device by epitaxial growth up to a semi-finished state corresponding to the state shown in FIG. 1 and FIGS. 2A and 2B prior to etching between the stacks.

A GaN substrate 1 is provided. An epitaxial structure 2 of one or more n-type layers is deposited on the substrate 1. The n-type layer(s) 2 form a common basis for all the different SLED light emitting regions, i.e. the same n-layers are used for all the different SLEDs. The n-layers are grown at the same time over the whole area of the substrate surface that is intended for SLEDs.

The surface of the n-type layers 2 is locally shaded with a first mask 10, which is preferably a dielectric, to prevent subsequent growth in the masked areas.

A first layer stack comprising in order of deposition: active layer(s) 3.1; and p-layer(s) 4.1 is deposited to form a first light emitting SLED structure having an emission wavelength range characterized by a center wavelength $\lambda 1$ and bandwidth $\Delta\lambda 1$ (or alternatively a wavelength range $\lambda 1(MIN)$ to $\lambda 1(MAX)$). An exclusion region S is formed at boundaries of the first SLED region's active layer(s) 3.1 and p-type layer(s) 4.1 and the first mask 10.

The first mask 10 is removed and a second mask 11, also preferably dielectric, is deposited to mask both the first SLED structure and part of the upper surface of the common n-type layer(s), not including a strip adjacent the first layer stack, which is left free for growth of the next layer stack.

A second layer stack comprising in order of deposition: active layer(s) 3.2; and p-layer(s) 4.2 is deposited to form a second light emitting SLED structure having an emission wavelength range characterized by a center wavelength $\lambda 2$ and bandwidth $\Delta\lambda 2$. The exclusion region between the first and second stacks is now thicker than previously as a consequence of growing the second stack. Moreover, a further exclusion region is formed at the boundaries of the second SLED's active layer(s) and p-type layer(s) 3.2, 4.2, the corresponding layers 3.1, 4.1 of the first SLED structure and the second mask 11.

The above steps are iterated 'n' times to form a monolithic multiple wavelength nitride-based SLED device having 'n' light emitting SLED structures, each emitting at a desired design wavelength range, e.g. as defined by center wavelength $\lambda n$, wherein two or more of the 'n' SLED structures may be designed to have the same emission characteristics, e.g. by being copies of each other, but wherein the 'n' SLEDs collectively are designed to have at least two different emission characteristics, e.g. a blue emission range and a green emission range.

As in the first example, a variant of the second example is to use etching and selective area growth as described for the first example.

Figure 12:
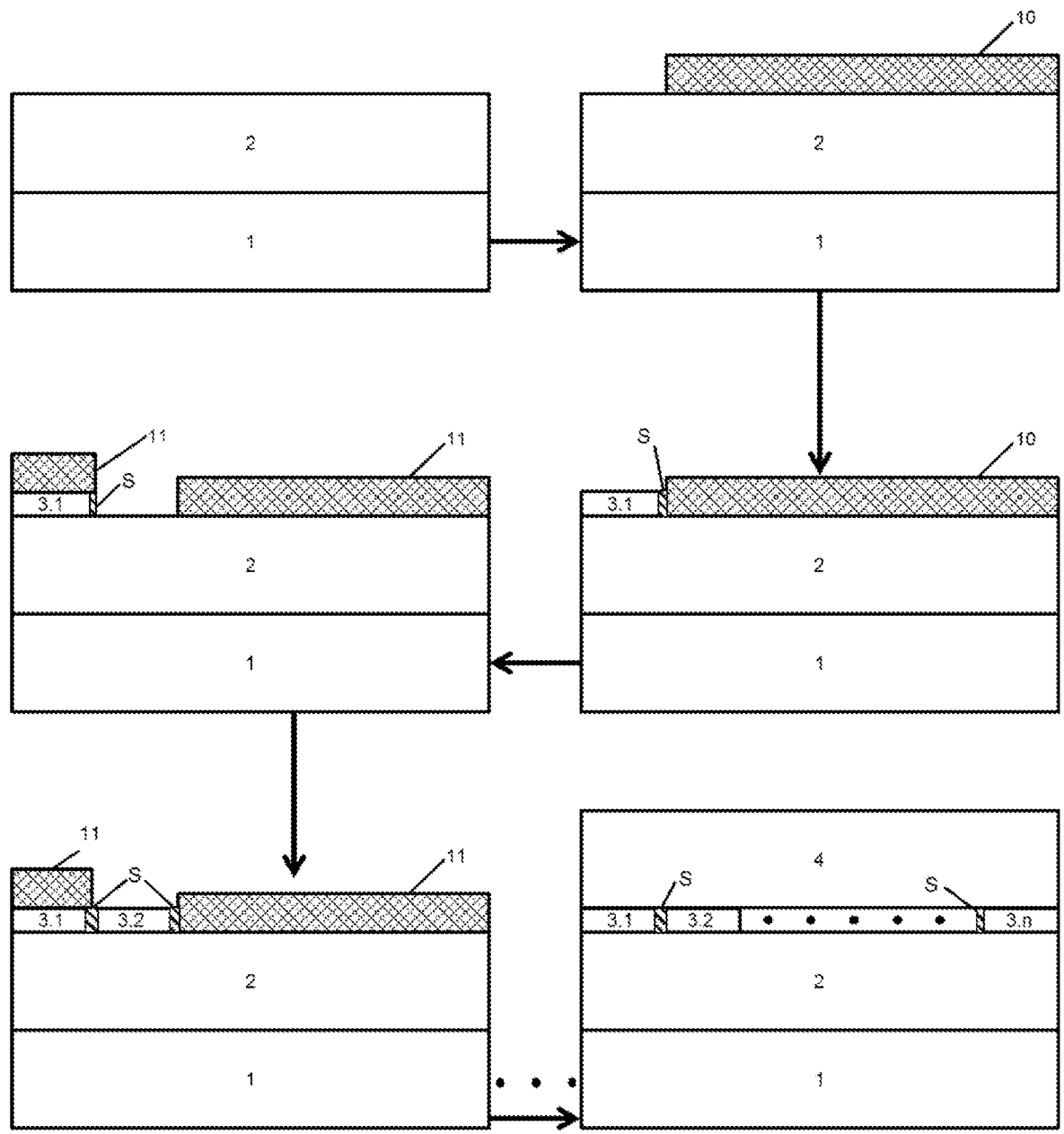
FIG. 12 shows steps of a third example fabrication method for producing a monolithic SLED device by epitaxial growth up to a semi-finished state corresponding to the state shown in FIG. 1 and FIGS. 2A and 2B prior to etching between the stacks.

FIG. 12 shows steps of a third example fabrication method for producing a monolithic SLED device by epitaxial growth up to a semi-finished state corresponding to the state shown in FIG. 1 and FIGS. 2A and 2B prior to etching between the stacks.

A GaN substrate 1 is provided. An epitaxial structure 2 of one or more n-type layers is deposited on the substrate 1. The n-type layer(s) 2 form a common basis for all the different SLED light emitting regions, i.e. the same n-layers are used for all the different SLEDs. The n-layers are grown at the same time over the whole area of the substrate surface that is intended for SLEDs.

The surface of the n-type layers 2 is locally shaded with a first mask 10, which is preferably a dielectric, to prevent subsequent growth in the masked areas.

A first layer stack comprising active layer(s) 3.1 is deposited. An exclusion region S is formed at boundaries of the first SLED's active layers 3.1 and the first mask 10.

The first mask 10 is removed and a second mask 11, also preferably dielectric, is deposited to mask both the active layer(s) 3.1 of what is to become the first SLED structure and part of the upper surface of the common n-type layer(s) 2, not including a strip adjacent the first active layer(s) 3.1, which is left free for growth of the next layer stack.

A second layer stack comprising active layer(s) 3.2 is deposited. The exclusion region S between the first and second active layer stacks 3.1 and 3.2 is now thicker than previously as a consequence of growing the second active layer(s) 3.2. Moreover, a further exclusion region S is formed at boundaries of the second SLED's active layer(s) 3.2 and the second mask 11.

The above steps are iterated 'n' times to form 'n' adjacent stacks of active layer(s) 3.n. The last mask layer is removed. A common p-type layer, or set of p-type layers, 4 is then deposited on the upper surface of the active layers 3.n to complete the SLED layer structure, which is a monolithic multiple wavelength nitride-based SLED structure which after further processing to form the ridges, contact electrodes and so forth has 'n' light emitting SLED structures, each emitting at a desired design wavelength range, e.g. as defined by a center wavelength λn and a bandwidth Δλ1 (or alternatively a wavelength range λn(MIN) to λn(MAX)). Two or more of the 'n' SLED structures may be designed to have the same emission characteristics, e.g. by being copies of each other, but wherein the 'n' SLEDs collectively are designed to have at least two different emission characteristics, e.g. a blue emission range and a green emission range. The common n-type layer(s) 2, the individual SLED-specific active layer(s) 3n and the common p-type layer(s) 4 form part of a first light emitting SLED structure which is to have an emission wavelength range characterized by a center wavelength λn and bandwidth Δλn.

As in the first example, a variant of the third example is to use etching and selective area growth.

All the above examples can be used to realize monolithic dual-wavelength (e.g. BG) nitride-based SLED arrays or monolithic triple-wavelength (e.g. RGB) nitride-based SLED arrays.

Figure 13:
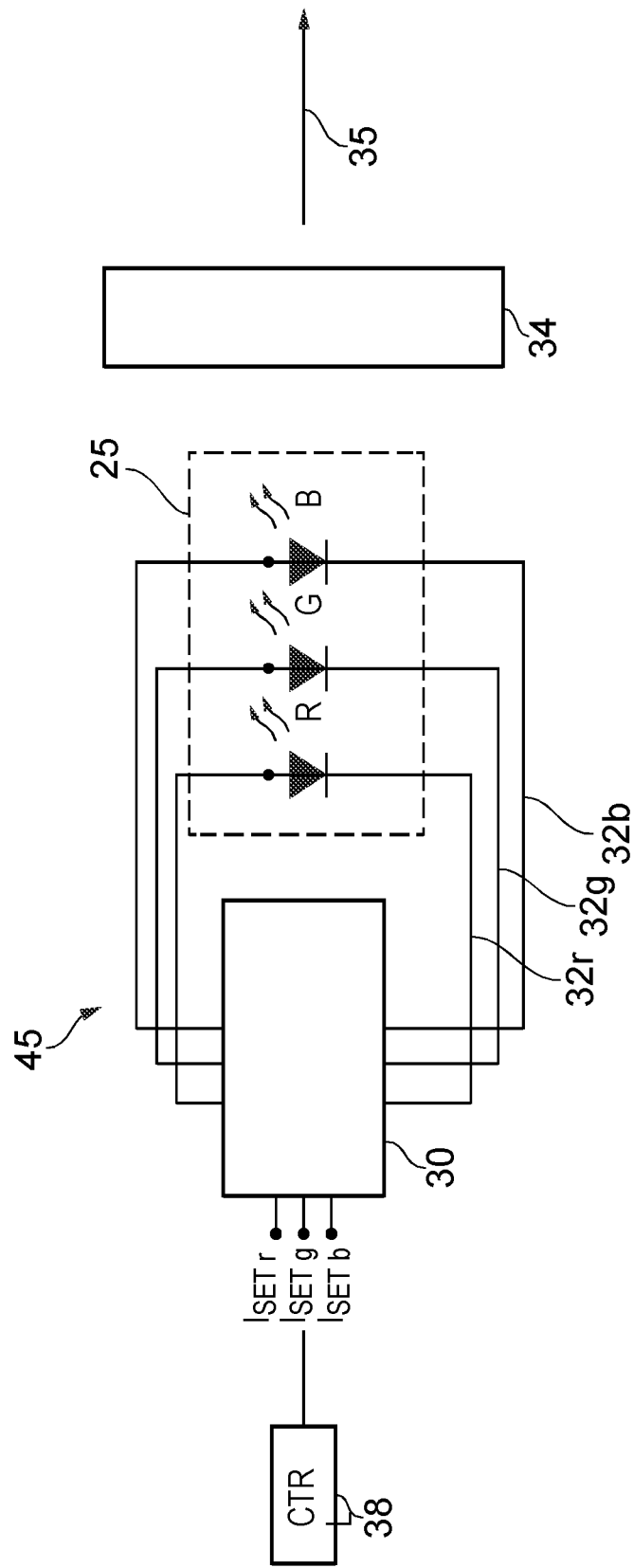
FIG. 13 is a schematic drawing of a drive circuit and other components suitable for integration of a SLED device or module embodying the invention.

FIG. 13 is a schematic drawing of a light source unit 45 including a drive circuit and other components suitable for integration of a 3-emitter SLED device or module 25 embodying the invention, the three emitters being labelled R, G and B for red, green and blue. The three SLEDs are driven by respective circuits 32r, 32g and 32b from a driver unit 30 which receives respective drive currents $I_{SETr}$, $I_{SETg}$, $I_{SETb}$ from a controller 38. The red, green and blue light beams output from the SLEDs are combined by optical elements 34 into a single RGB light beam 35.

Figure 14:
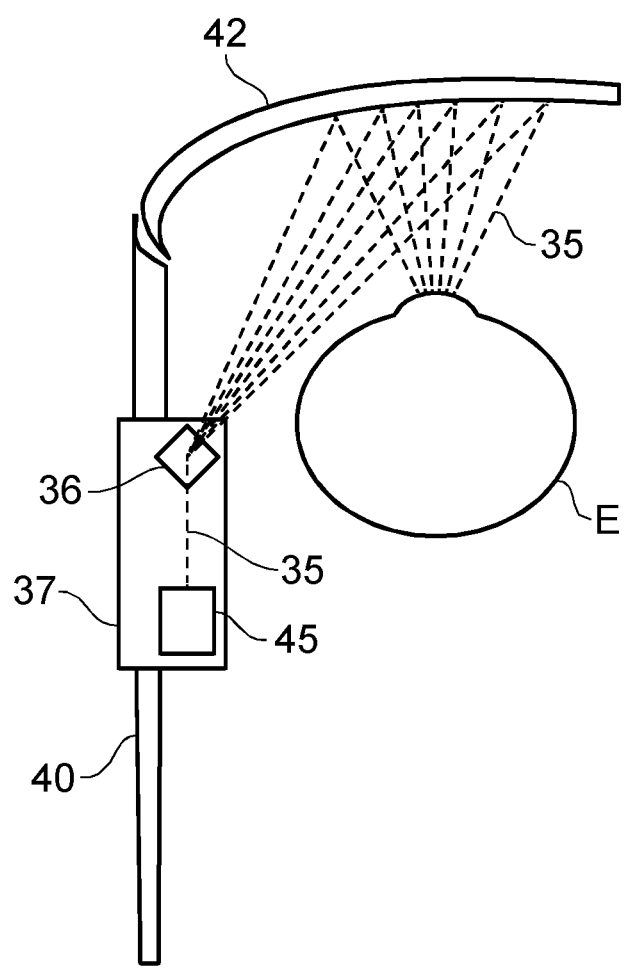
FIG. 14 shows an example direct projection system in a monocle format which comprises an RGB source module embodying the invention.

FIG. 14 shows an example direct projection system in a monocle format, i.e. glasses or spectacles for a single eye. A housing 37 is integrated midway along a temple 40 and houses the light source unit 45 of FIG. 13. The combined RGB light beam 35 output by the light source unit 45 is directed to a scanning element 36 which projects an image on the inside surface of a lens 42 which is then reflected onto a wearer's eye E to directly project into the eye. It will be understood that the same basic structure would be suitable for conventional use, where an image is formed on the inside surface of the lens for the wearer to view conventionally. Moreover, it will be understood that the reference to the lens 42 does not imply that the lens 42 has any lensing function insofar as the projection system is concerned, rather it merely serves to provide a reflection surface for direct projection (or projection surface for conventional projection).

Figure 15:
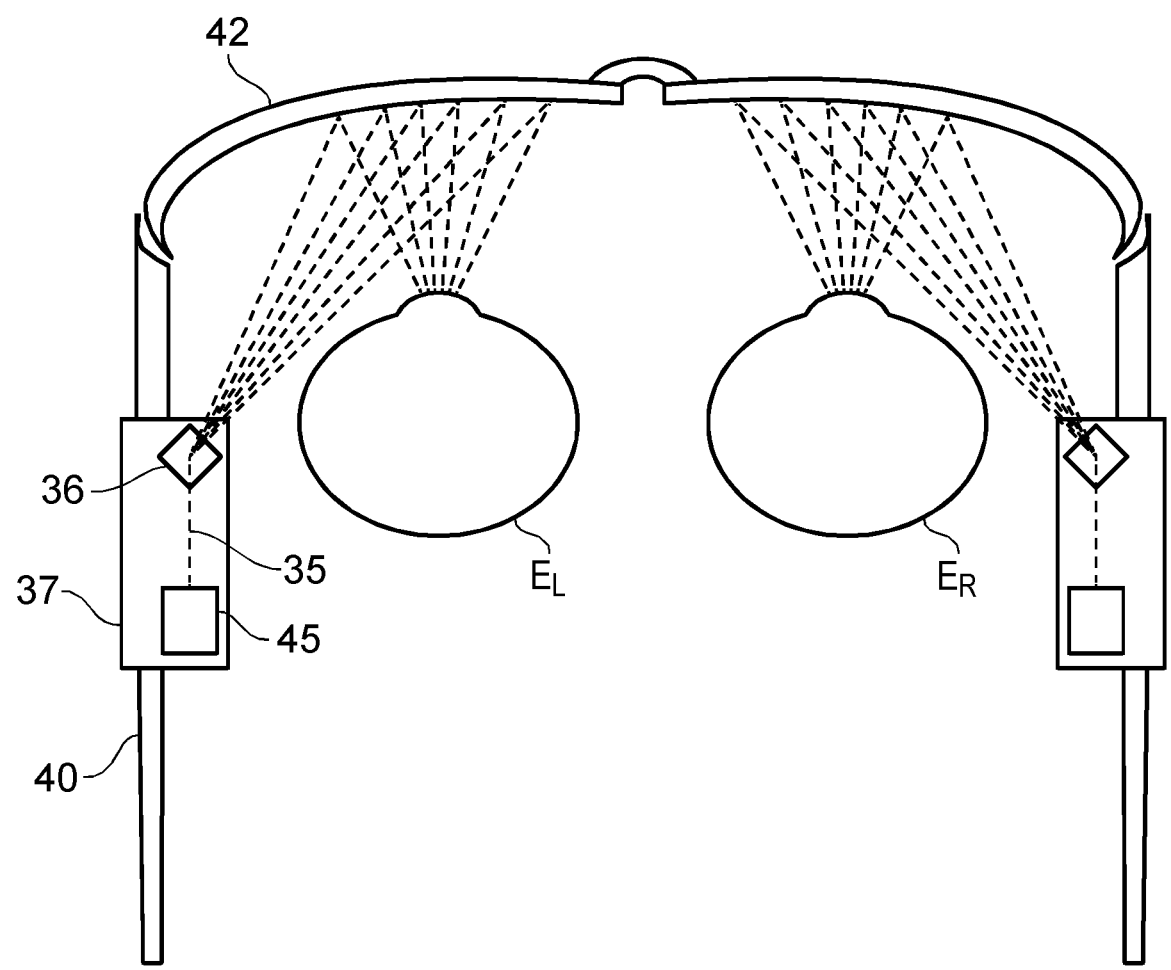
FIG. 15 shows an example direct projection system in a spectacles format which comprises an RGB source module embodying the invention.

FIG. 15 shows an example direct projection system in a spectacles format which is essentially a doubled-up version of the single-eye system of FIG. 14 for direct projection into the left eye $E_L$ and right eye $E_R$. The same reference numerals are used. Projection into both eyes allows for additional possibilities, such as stereoscopic imaging for 3D.

Figure 16:
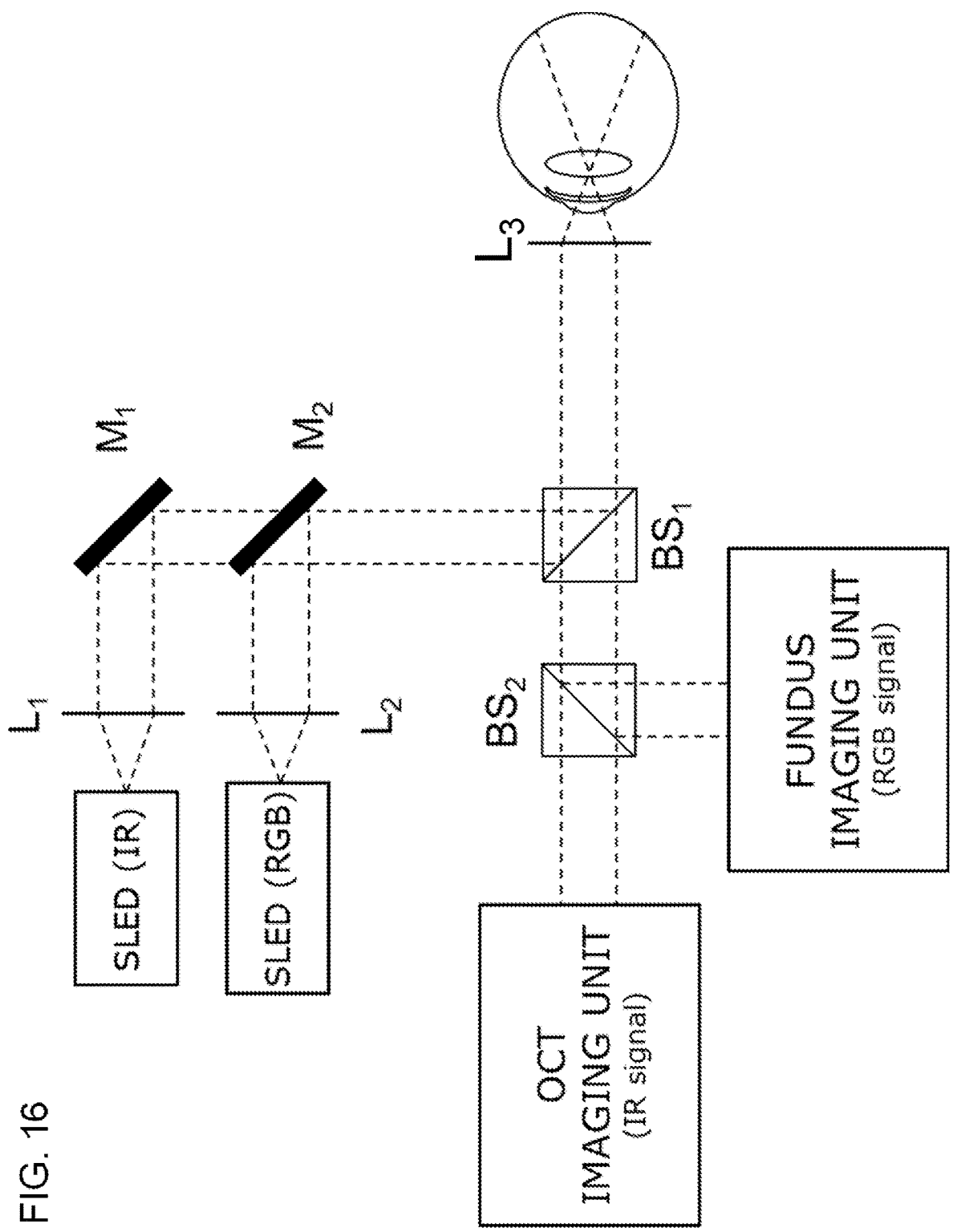
FIG. 16 is a schematic diagram of an example combined optical coherence tomography (OCT) and fundus imaging system which comprises two SLED source modules embodying the invention.

FIG. 16 is a schematic drawing of a combined OCT and fundus imaging system for obtaining images of a human or mammalian eye employing two SLED source modules as described above, one with IR output band for OCT imaging and another with a visible (RGB) output band for fundus imaging. The specification of the RGB SLED source module's output is, for example: blue SLED with a center wavelength of 455 nm and a 3 dB bandwidth of 30 nm, green SLED with a center wavelength of 510 nm and a 3 dB bandwidth of 30 nm, and red SLED with a center wavelength of 650 nm and a 3 dB bandwidth of 60 nm. The specification of the IR SLED source module's output is, for example: center wavelength of 845 nm, 3 dB bandwidth of 145 nm, 10 dB bandwidth of 165 nm, 10 dB wavelength range of 765-930 nm, 10 mW output power and a coherence length of 2.9 micrometers. It will be appreciated this output is from the red end of the visible to near-infrared, which is suitable for OCT systems. The IR SLED module may have a wavelength range from red to near-infrared, e.g. wavelengths from 700 nm to 1.5 □m. The IR SLED module may comprise a single SLED or multiple SLEDs, for example a red SLED and/or one or more IR SLEDs with respective wavelength ranges that partially overlap so as to provide a single continuous wavelength range of emission over a wider range than is possible with a single SLED emitter. With partial overlap to provide a single continuous wavelength range, the partial overlaps may be arranged so that the output power spectrum is as constant as possible over the transition between outputs from the respective SLEDs of the IR SLED module.

The parts shown are as follows:

| | |
|---|---|
| SLED (IR) | IR SLED source module |
| SLED (RGB) | RGB/white-light source module |
| BS1, BS2 | beam splitters |
| L1-L3 | lenses |
| M1, M2 | mirrors |

The SLED source modules can be treated effectively as point sources, since the three SLED outputs are so close together, as described above, e.g. forming a triangle with side lengths of, for example 30-100 μm. Each SLED module can thus be treated as outputting a divergent circular or elliptical section beam which passes through an appropriate lens or lens system, marked L1 and L2 respectively, for collimating the beams. The collimated beams are reflected 90 degrees by plane mirrors M1 and M2 into a common path, wherein mirror M2 allows the IR SLED beam to pass through it and combine with the RGB SLED beam at the front face of mirror M2. A beam splitter BS1 is arranged to reflect the IR and SLED beam onto a focusing lens L3, which focuses the SLED beams onto a desired focal plane on the eye, e.g. cornea, lens, pupil or retina. The light which is backscattered from the eye is directed back through the same path until beam splitter BS1. At the beam splitter BS1 the backscattered component passes through without reflection to a second beam splitter BS2 which allows IR light to pass through it and be received by an OCT imaging unit and which reflects RGB light by 90 degrees into a fundus imaging unit. We have illustrated a specific static-field OCT/fundus imaging configuration, by way of example only, but the SLED source module is also suitable for use in a scanning field OCT/fundus system. Example applications of the SLED source module include: line-field imaging and sensing techniques, where the beam is kept static; line-field imaging and sensing techniques, where the beam is scanned across an object; line-field illumination, where the beam is kept static; and line-field illumination, where the beam is scanned. Line-field projection devices are, in the context of this disclosure understood to include methods that steer a line-shaped beam across an object. The beam might also be spatially modulated, e.g. by using digital mirror devices, spatial light modulators or similar. It will be understood that either the OCT-specific or the fundus-specific components could be removed from the illustrated system to make a fundus system or an OCT system respectively.

Figure 17:
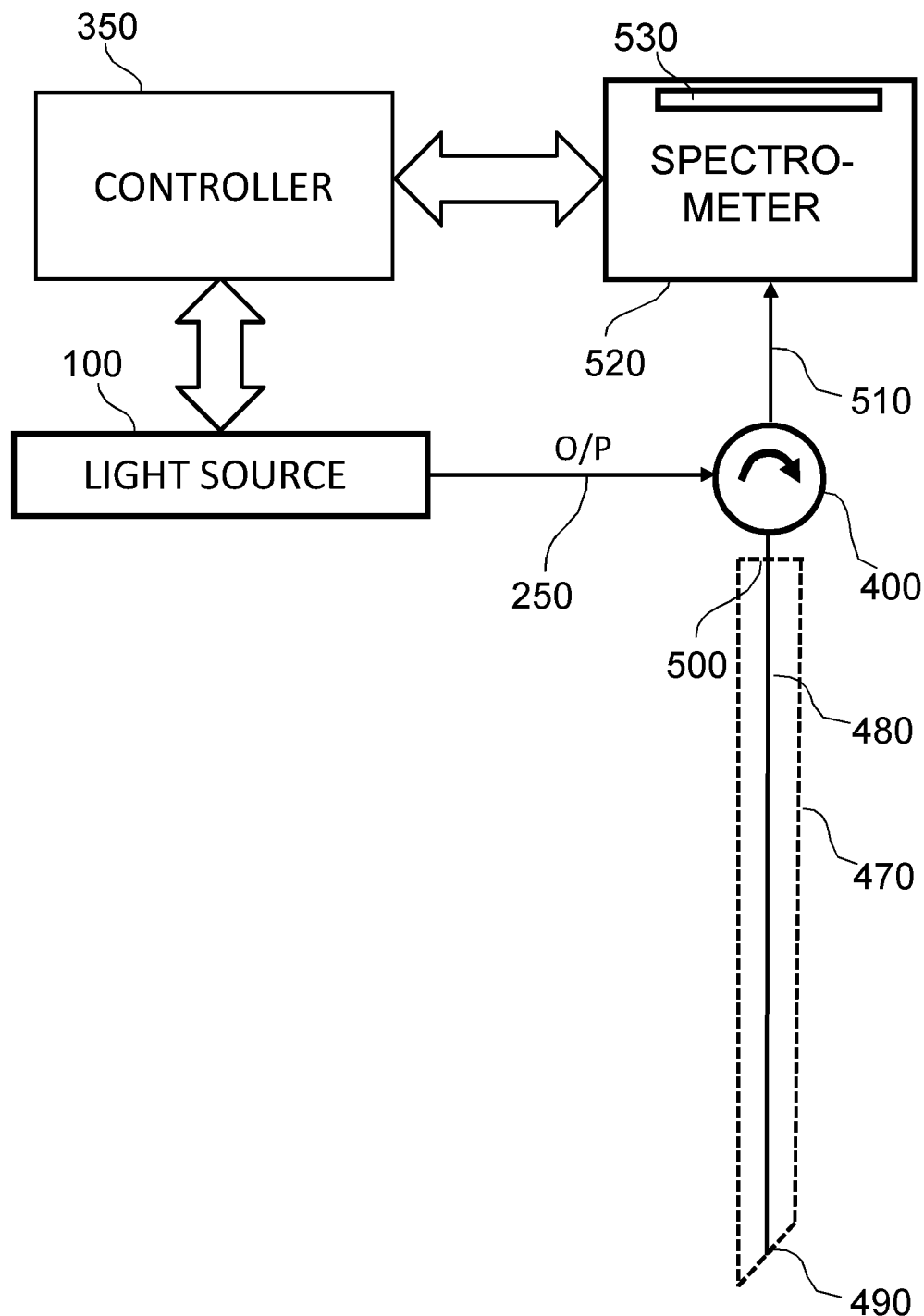
FIG. 17 is a schematic drawing of a medical device system comprising a SLED source device or module embodying the invention, and downstream optical components, wherein the downstream optical components form an endoscopic, laparoscopic, bronchoscopic or catheter-like medical device.

FIG. 17 is a schematic drawing of a medical device system comprising a SLED light source device or module 100 as described above and downstream optical components that form an endoscopic, laparoscopic, bronchoscopic or catheter-like medical device. An optical path 250 connects the light source 100 and an optical circulator 400. The system further comprises an insertion tube 470, which may be rigid or flexible, suitable for insertion into a patient, for example into a bodily orifice, such as a blood vessel, digestive tract, lung, colon, oesophagus etc. The insertion tube 470 includes a light guide 480 which may be formed entirely or in part from an optical fibre or optical fibre bundle, or may be a hollow light guiding tube or some other light guide, and may include free-space optical elements such as lenses, e.g. for collimating, coupling in, coupling out and focusing. The light guide terminates at or near a distal tip 490 of the insertion tube. Light from the light source 100 is supplied to the distal tip 490 via the circulator 400 and any necessary coupling optics (not shown) between the circulator 400 and proximal end 500 of the insertion tube. Light collected from the sample area adjacent the distal tip 490 of the insertion tube 470, e.g. by scattering or fluorescence, may be guided back to the detection optics also by the same light guide 480 that conveyed the excitation light, or via a different light guide (not shown) arranged in the insertion tube 470. The collected light passes through the circulator 400 via a light path 510 to a spectrometer 520 and light detector 530. If no spectral filtering of the collected light signal is needed, then a spectrometer will of course not be present prior to the light detector. The light detector 530 may be an array detector such as a charged coupled device (CCD) or photodiode array, or a light detector without spatial resolution, e.g. a single photodiode. The system is under the control of a controller 350 via control lines schematically illustrated with double-headed arrows which may additionally have data processing functionality, e.g. for image processing or other data analysis of signals received at the detector 530. Alternatively, measurement data may be passed, e.g. by the controller, to a separate computing apparatus for image processing and/or data analysis. As in the previous embodiments, various components may be integrated into a PIC 240 and/or a COP 230. Another variation would be to replace the circulator with a fused fibre coupler or free-space coupler.

It is to be understood that the above description is intended to be illustrative, and not restrictive. Many other embodiments will be apparent to those skilled in the art, upon reviewing the above description. The scope of the invention should, therefore, be determined with reference to any appended claims, along with the full scope of equivalents to which such claims are entitled.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc. as appropriate to the invention.

Even though particular combinations of features are recited in the claims and/or disclosed in the specification, these combinations are not intended to limit the disclosure of possible implementations. Features may be combined in ways not explicitly recited in the claims and/or disclosed in the specification. Although each dependent claim listed below may directly depend less than all of the other claims, the disclosure of possible implementations may include various other combinations of the claimed features within the scope of the invention.

No element, act, or instruction used herein should be construed as critical or essential unless explicitly described as such. Also, as used herein, the articles "a" and "an" are intended to include one or more items, and may be used interchangeably with "one or more", "at least one", etc., unless specified noted. Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to include "based, at least in part, on" unless explicitly stated otherwise.

What is claimed is:

1. A superluminescent light emitting diode, SLED, device comprising:
   front and back facets;
   a substrate;
   a first GaAlInN-based epitaxial stack arranged on the substrate and including in sequence along an epitaxial growth axis: one or more n-type doped layers, one or more active layers forming an active region dimensioned and configured to generate and amplify light emission over a first wavelength range of between 3 nm and 100 nm at full width half maximum and a center wavelength between 440 nm and 470 nm, and one or more p-type doped layers, wherein the first epitaxial stack has a first ridge formed in the p-type doped layers and extending at least part way from the front facet to the back facet to induce a first waveguiding region in the first active layers that defines at least part of a first optical path between the front and back facets; and
   a second GaAlInN-based epitaxial stack arranged on the substrate alongside the first epitaxial stack and including in sequence along the epitaxial growth axis: one or more n-type doped layers, one or more active layers forming an active region dimensioned and configured to generate and amplify light emission over a second wavelength range of between 3 nm and 100 nm at full width half maximum and a center wavelength between 490 nm and 530 nm, and one or more p-type doped layers, wherein the second wavelength range is different from the first wavelength range, and wherein the second epitaxial stack has a second ridge formed in the p-type doped layers separated from the first ridge by a lateral distance and extending at least part way from the front facet to the back facet to induce a second waveguiding region in the second active layers that defines at least part of a second optical path between the front and back facets.

2. The device of claim 1, wherein the substrate is GaAlInN-based.

3. The device of claim 1, wherein, to suppress lasing in the first and second wavelength ranges, one or more of the following features is provided:
   a) the first and/or second ridges extend such that the first and second optical paths intersect with the front facet, and optionally also the back facet, at first and second non-normal angles;
   b) the first and/or second ridges are straight and extend at a non-normal angle to the front facet;
   c) the first and/or second ridges include a curved portion such that the first and second optical paths intersect with the front facet at first and second non-normal angles;
   d) first and/or second absorber materials are provided which are respectively absorbent over the first and second wavelength ranges, the first and second absorber materials being located adjacent the back facet;
   e) the first and/or second ridges terminate part way between the front and back facets;
   f) the first and/or second ridges terminate part way between the front and back facets at a tilt angle so that reflections from the back facet are inhibited from coupling back into the waveguide; and
   g) front and/or back anti-reflection coatings are provided on the front and/or back facets.

4. The device of claim 1 further comprising:
   a third epitaxial stack arranged on the substrate alongside the second epitaxial stack and including in sequence: one or more n-type doped layers, one or more active layers forming a third active region dimensioned and configured to generate and amplify light emission over a third wavelength range of between 3 nm and 100 nm at full width half maximum and a center wavelength between 620 nm and 670 nm, and one or more p-type doped layers, wherein the third wavelength range is different from the first and second wavelength ranges, and wherein the third epitaxial stack has a third ridge formed in the p-type doped layers separated from the first ridge by a lateral distance and extending at least part way from the front facet to the back facet to induce a third waveguiding region in the third active layers that defines at least part of a third optical path between the front and back facets.

5. The device of claim 4, wherein the third epitaxial stack is GaAlInN-based.

6. The device of claim 4, wherein, to suppress lasing in the third wavelength range, one or more of the following features is provided:
   a) the third ridge extends such that the third optical path intersects with the front facet, and optionally also the back facet, at a non-normal angle;
   b) the third ridge is straight and extends at a non-normal angle to the front facet;
   c) the third ridge includes a curved portion such that the third optical path intersects with the front facet at a non-normal angle;
   d) third absorber material is provided which is absorbent over the third wavelength range, the third absorber material being located adjacent the back facet;
   e) the third ridge terminates part way between the front and back facets;
   f) the third ridge terminates part way between the front and back facets at a tilt angle so that reflections from the back facet are inhibited from coupling back into the waveguide; and
   g) front and/or back anti-reflection coatings are provided on the front and/or back facets.

7. The device of claim 1, wherein the wavelength ranges are each between 3 nm and 30 nm at full width half maximum.

8. The device of claim 7, wherein the wavelength ranges are each between 3 nm and 30 nm at full width half maximum.

9. The device of claim 1, wherein the lateral distance is between 10 and 100 microns.

10. A superluminescent light emitting diode, SLED, device comprising:
   front and back facets;
   a substrate;
   a plurality of at least four GaAlInN-based epitaxial stacks arranged adjacent to each other on the substrate,
   each epitaxial stack including in sequence along an epitaxial growth axis:
   a) one or more n-type doped layers;
   b) one active layers forming an active region dimensioned and configured to generate and amplify light emission over a wavelength range of between 3 nm and 100 nm at full width half maximum; and
   c) one or more p-type doped layers;
   d) a ridge formed in the p-type doped layers and extending at least part way from the front facet to the back facet to induce a waveguiding region in the active layers that defines at least part of an optical path between the front and back facets;
   wherein the epitaxial stacks are configured such that there are at least two different wavelength ranges among the epitaxial stacks, namely a first wavelength range with a center wavelength between 440 nm and 470 nm and a second wavelength range which is different from the first wavelength range with a center wavelength between 490 nm and 530 nm.

11. The device of claim 10, wherein the epitaxial stacks are arranged such that there is a first group of adjacent epitaxial stacks with the first wavelength range and a second group of adjacent epitaxial stacks with the second wavelength range.

12. The device of claim 10, wherein the epitaxial stacks are arranged such that adjacent epitaxial stacks have the first wavelength range and the second wavelength range.

13. A superluminescent light emitting diode, SLED, module comprising:
   a SLED device comprising:
   front and back facets;
   a substrate;
   a first GaAlInN-based epitaxial stack arranged on the substrate and including in sequence along an epitaxial growth axis: one or more n-type doped layers, one or more active layers forming an active region dimensioned and configured to generate and amplify light emission over a first wavelength range of between 3 nm and 100 nm at full width half maximum and a center wavelength between 440 nm and 470 nm, and one or more p-type doped layers, wherein the first epitaxial stack has a first ridge formed in the first p-type doped layers and extending at least part way from the front facet to the back facet to induce a first waveguiding region in the first active layers that defines at least part of a first optical path between the front and back facets; and
   a second GaAlInN-based epitaxial stack arranged on the substrate alongside the first epitaxial stack and including in sequence along the epitaxial growth axis: one or more n-type doped layers, one or more active layers forming an active region dimensioned and configured to generate and amplify light emission over a second wavelength range of between 3 nm and 100 nm at full width half maximum and a center wavelength between 490 nm and 530 nm, and one or more p-type doped layers, wherein the second wavelength range is different from the first wavelength range, and wherein the second epitaxial stack has a second ridge formed in the second p-type doped layers and extending at least part way from the front facet to the back facet to induce a second waveguiding region in the second active layers that defines at least part of a second optical path between the front and back facets; and a further SLED device comprising:

further front and back facets;

a further substrate;

a third epitaxial stack arranged on the further substrate including in sequence along a third epitaxial growth axis: one or more n-type doped layers, one or more active layers forming an active region dimensioned and configured to generate and amplify light emission over a third wavelength range of between 3 nm and 100 nm at full width half maximum, and a center wavelength between 620 nm and 670 nm, and one or more p-type doped layers, wherein the third wavelength range is different from the first and second wavelength ranges, and wherein the third epitaxial stack has a third ridge formed in the p-type doped layers and extends at least part way from the further front facet to the further back facet to induce a third waveguiding region in the third active layers that defines at least part of a third optical path between the further front and back facets; and a mount on which are arranged the SLED device and the further SLED device, the further SLED device being inverted relative to the first SLED device, so that in section through the front facet and further front facet first, second and third optical axes of the first, second and third waveguiding regions form an acute triangle.

14. The module of claim 13, wherein the acute triangle is one of an equilateral triangle, and an isosceles triangle with its base defined by a line between the first and second optical axes, the acute triangle being equilateral or isosceles to an approximation defined by its internal angles having values within 5 degrees of a geometric definition of equilateral and isosceles respectively.

15. The module of claim 13, wherein the ridges generate a ridged surface structure in both the SLED and further SLED devices, and the mount arranges the SLED device and the further SLED device such that their ridged surface structures at least partially intermesh.

16. The module of claim 13, wherein the internal angles of the acute triangle are all less than 75 degrees.

17. The module of claim 13, wherein the mount comprises a sub-mount on which is arranged the SLED and a further sub-mount on which is arranged the further SLED device, and wherein the sub-mount and further sub-mount are connected to each other.

18. The module of claim 13, wherein the SLED device and the further SLED device are arranged in the mount with a gap between them.

19. The module of claim 13, wherein the SLED device and the further SLED device are arranged in physical contact with each other.

20. The module of claim 13, wherein the substrate and epitaxial stacks of the further SLED device are one of GaAlInN-based; GaAlInP-based; and GaAlAs-based.

21. The device of claim 13, wherein the wavelength ranges are each between 3 nm and 30 nm at full width half maximum.

22. The device of claim 13, wherein the second ridge is separated from the first ridge by a lateral distance.

23. The device of claim 13, wherein the lateral distance is between 10 and 100 microns.

24. The device of claim 13, wherein the acute triangle has first, second and third sides, the first side being a base defined by a line between the first and second optical axes, the base having a length of between 10 and 100 microns, and the second and third sides having lengths of 100 microns or less.

* * * * *